United States Patent
Kim et al.

(10) Patent No.: US 11,390,803 B2
(45) Date of Patent: *Jul. 19, 2022

(54) SCINTILLATOR AND METHOD FOR MANUFACTURING THE SAME

(71) Applicant: Kyungpook National University Industry-Academic Cooperation Foundation, Daegu (KR)

(72) Inventors: Hong Joo Kim, Daegu (KR); Hwanbae Park, Daejeon (KR); Sunghwan Kim, Daegu (KR); Gul Rooh, Mardan (PK)

(73) Assignee: KYUNGPOOK NATIONAL UNIVERSITY INDUSTRY-ACADEMIC COOPERATION FOUNDATION, Daegu (KR)

( * ) Notice: Subject to any disclaimer, the term of this patent is extended or adjusted under 35 U.S.C. 154(b) by 509 days.

This patent is subject to a terminal disclaimer.

(21) Appl. No.: 16/093,873

(22) PCT Filed: Apr. 14, 2017

(86) PCT No.: PCT/KR2017/004045
§ 371 (c)(1),
(2) Date: Oct. 15, 2018

(87) PCT Pub. No.: WO2017/179935
PCT Pub. Date: Oct. 19, 2017

(65) Prior Publication Data
US 2019/0106623 A1  Apr. 11, 2019

(30) Foreign Application Priority Data

Apr. 15, 2016 (KR) .................. 10-2016-0046030
Apr. 15, 2016 (KR) .................. 10-2016-0046033

(51) Int. Cl.
C09K 11/85 (2006.01)
C09K 11/77 (2006.01)
(Continued)

(52) U.S. Cl.
CPC .......... C09K 11/7772 (2013.01); C09K 11/62 (2013.01); C09K 11/628 (2013.01);
(Continued)

(58) Field of Classification Search
CPC ............ C09K 11/7772; C09K 11/7719; C09K 11/772; C09K 11/626; C09K 11/628
See application file for complete search history.

(56) References Cited

U.S. PATENT DOCUMENTS 7,180,068 B1  2/2007 Brecher et al.
7,368,719 B2  5/2008 Srivastava et al.
(Continued)

FOREIGN PATENT DOCUMENTS

KR  20070065822 A  6/2007
KR  20150145742 A  12/2015
(Continued)

OTHER PUBLICATIONS

Higgins. Bridgman growth of LaBr3:Ce and LaCl3:Ce crystals for high-resolution gamma-ray spectrometers. Journal of Crystal Growth 287 (2006) 239-242 (Year: 2006).*

(Continued)

Primary Examiner — Matthew E. Hoban
(74) Attorney, Agent, or Firm — Carter, DeLuca & Farrell LLP

(57) ABSTRACT

A scintillator, a preparation method therefor, and an application thereof are disclosed wherein the scintillator has a chemical formula of $Tl_aA_bB_c$:yCe, wherein: A is at least one rare earth element selected from trivalent rare earth elements; B is at least one halogen element selected from
(Continued)

halogen elements; a=1, b=2 and c=7, a=2, b=1 and c=5, or a=3, b=1 and c=6; and y is greater than or equal to 0 and less than or equal to 0.5. According to another embodiment, the scintillator has a chemical formula of $Tl_aA_bB_c$:yEu, wherein: A is an alkaline earth metal element; B is a halogen element; a=1, b=2 and c=5, or a=1, b=1 and c=3; and y is greater than or equal to 0 mol % and less than or equal to 50 mol %.

9 Claims, 15 Drawing Sheets

(51) Int. Cl.
  *C09K 11/62* (2006.01)
  *C30B 11/00* (2006.01)
  *C30B 29/12* (2006.01)

(52) U.S. Cl.
  CPC .......... *C09K 11/77* (2013.01); *C09K 11/7719* (2013.01); *C09K 11/7733* (2013.01); *C30B 11/002* (2013.01); *C30B 11/003* (2013.01); *C30B 29/12* (2013.01)

(56) References Cited

U.S. PATENT DOCUMENTS

| | | | |
|---|---|---|---|
| 8,779,365 B2 | 7/2014 | Williams | |
| 10,126,436 B2* | 11/2018 | Kim | C09K 11/62 |
| 2007/0131874 A1 | 6/2007 | Srivastava et al. | |
| 2008/0001086 A1 | 1/2008 | Srivastava et al. | |
| 2008/0131347 A1* | 6/2008 | Srivastava | C09K 11/772 423/263 |
| 2013/0126741 A1 | 5/2013 | Srivastava et al. | |
| 2016/0291169 A1* | 10/2016 | Hawrami | G01T 1/2023 |

FOREIGN PATENT DOCUMENTS

| | | |
|---|---|---|
| KR | 20160005666 A | 1/2016 |
| KR | 101641946 B1 | 7/2016 |
| KR | 101656752 B1 | 9/2016 |
| WO | 2008048720 A2 | 4/2008 |
| WO | 2015010055 A1 | 1/2015 |
| WO | 2015010055 A4 | 3/2015 |
| WO | 2015174584 A1 | 11/2015 |

OTHER PUBLICATIONS

International Search Report for International Application No. PCT/KR2017/004045 dated Jul. 26, 2017. (4 pages).
Kim et al., "Luminescence and scintillation properties of the new Ce-doped Tl2LiGdCl6 single crystals", Journal of Luminescence, vol. 164, Aug. 2015, pp. 86-89. (Abstract).
M. Gascon et al. "Scintillation properties of CsBa2I5activated with monovalent ions Tl+, Na+and In+",Journal of Luminescence, Elsevier BV North-Holland, NL, vol. 156, Aug. 2, 2014 (Aug. 2, 2014), pp. 63-68, XP029061833.
Extended European Search Report dated Nov. 12, 2020, for corresponding European Application No. 20191671.5.
S.S. Novosad "Thermo-and photostimulated luminescence of CaI2: Tl and CaI2: Pb crystals", Optics and Spectroscopy, vol. 88, No. 4, Apr. 1, 2000 (Apr. 1, 2000), pp. 522-526, XP055745726.
Partial Supplementary European Search Report issued in Application No. 17782690.6 dated Nov. 8, 2019. (11 pages).
Extended European Search Report issued in Application No. 17782690.6 dated Feb. 12, 2020. (10 pages).

\* cited by examiner

SCINTILLATOR AND METHOD FOR MANUFACTURING THE SAME

CROSS REFERENCE TO RELATED APPLICATIONS

This application is a national phase of PCT Application No. PCT/KR2017/004045 filed on Apr. 14, 2017, which claims the benefit of and priority to Korean Patent Application Nos. 10-2016-0046030 and 10-2016-0046033, both filed on Apr. 15, 2016, each of which are hereby incorporated by reference herein in their entirety.

TECHNICAL FIELD

The present invention relates to a scintillator, a method for manufacturing the same, and an application thereof.

BACKGROUND

A scintillation phenomenon is a phenomenon in which when radioactive rays, such as X-rays, neutron rays, and charged particles, are irradiated to crystalline, light is generated at the same time when the radioactive rays are irradiated. A scintillator is a radioactive ray sensor that converts ionized radioactive rays to light of a wavelength area of visual rays. Radioactive ray information may be obtained by measuring the light generated then by using a light receiving element, such as a photoelectron multiplier or a photodiode. As an example, the radioactive ray information obtained by a scintillator may be obtained as a radioactive ray image through a series of processing processes. The scintillators are widely used to measure and image radioactive rays in the fields of medical image systems, such as computed tomography (CT), positron emission tomography (PET), a gamma camera, single photon emission computed tomography (SPECT), medical image systems, various radioactive ray detectors, atomic power plants, and industrial radioactive ray sensors, and the like.

An ideal scintillation crystal that is required in most of application fields has to have a high atomic number and a high optical yield to increase detection efficiency for an X-ray or a gamma ray, has to have no afterglow, and has to have a short fluorescent damping time to rapidly process a detection signal. Further, the light emission wavelength of the scintillator has to coincide with the characteristics of a light receiving element, such as a photoelectron multiplier or a photodiode, and the scintillator has to be mechanically firm, has to have an excellent radiation tolerance, and has a long life span as well. Further, the single crystal of the scintillator has to be easily grown and inexpensive. However, the scintillation crystals have advantages and disadvantages thereof so that it is difficult for one kind of scintillator to be used all application fields.

Since Hofstadter announces NaI:Tl in 1948, various kinds of scintillators have been developed until now as radioactive medical science, nuclear physics, and high-energy physics, and the like have developed. Starting with NaI:Tl, scintillators, such as akali-halide including CsI and CaI:Tl, BGO ($Bi_4Ge_3O_{12}$), $PbWO_4$, LSO ($Lu_2SiO_5$:Ce), $LaBr_3$:Ce, and $SrI_2$:Eu have been studied. The single crystals of CsI and NaI-based halide scintillators may be easily grown and the optical yields thereof are high, but efficiency of detecting X-rays and gamma rays is relatively low because the atomic numbers of Cs, Na, and I are low.

High density BGO ($Bi_4Ge_3O_{12}$) has been used in computed tomography (CT), $PbWO_4$ has been used for high-energy physics, and LSO ($Lu_2SiO_5$:Ce) has been used for positron emission tomography (PET) due to excellent fluorescent damping time characteristics (40 ns) and an excellent detection efficiency. The X-ray detection efficiencies of BGO 와 $PbWO_4$ are high because the atomic numbers of Bi, Pb, and W are relatively high values of 83, 82, and 74, but BGO 와 $PbWO_4$ have very low optical yields (8,200 phs/MeV, BGO) (200 phs/MeV, $PbWO_4$) as compared with the optical yields (65,000 phs/MeV, CsI:Tl) (38,000 Phs/MeV, NaI:Tl) of the halide-based scintillators. The prices of the material of Lu-based oxide scintillator is expensive, the melting temperature thereof is very high, and the crystal structure thereof makes it difficult to grow a crystal of a scintillator. Further, the background of the Lu-based scintillator is high due to a total of 34 natural radioisotopes in addition to $^{176}Lu$ (half-life: $3.78\times10^{10}$ years, natural abundance: 2.59%) that is present in Lu.

$LaBr_3$:Ce is a scintillator developed by van Loef et al. in 2001 and has an excellent energy resolution as compared with existing NaI:Tl for a gamma ray of cesium-137 662 keV, but is a hexagonal crystal structure, by which it is difficult to grow a single crystal and which has a high humidity absorption property. In recent years, scintillators based on alkaline earth metallic elements have been studied and developed, and among them, the optical yield of an $SrI_2$:Eu scintillator is a very high value of 80,000~120,000 phs/MeV, but the scintillators also have very high humidity absorption properties and the atomic numbers thereof are low so that detection efficiency for radioactive rays is low. $Ba_2CsI_5$:Eu is a scintillator developed by Bbourret-Courchesne et al., in 2009 and has very excellent characteristics, such as an optical yield of 97,000 phs/MeV and an energy resolution performance of 3.8% for a Cs-137 662 keV gamma ray. A $CsSr_{1-x}Eu_xI_3$ scintillator developed by Yang et al. in 2010 has characteristics that are similar to those of $Ba_2CsI_5$:Eu, such as an optical yield of 65,000 ph/MeV and an energy resolution performance of 5.9%. Most of the alkaline earth metal based scintillators have high optical yields and excellent energy resolution performances, but the atomic numbers of the bases thereof are low so that gamma ray detection efficiencies also low.

SUMMARY

An objective of the present invention is to provide an advanced material scintillator having a high detection efficiency for radioactive rays, a high optical yield, and excellent fluorescent damping time characteristics, a method for manufacturing the same, and an application thereof.

Another objective of the present invention is to provide an advanced material scintillator having excellent scintillation characteristics, such as a high detection efficiency for radioactive rays while taking Tl having a high atomic number of 81 as a matrix material and a high optical yield by doping Eu with an activator, a method for manufacturing the same, and an application thereof.

The objects of the present invention are not limited to the above-described ones. Other technical objects that are not mentioned will be clearly understood from the following description by those skilled in the art to which the present invention pertains.

A scintillator according to an aspect of the present invention includes a matrix material (base material) including thallium, at least one rare earth element, and at least one halogen element, and the scintillator includes a matrix material that does not include an alkaline element as a main substance.

The scintillator may further include an activator, with which the matrix material is doped, and the activator may include cerium.

A chemical formula of the scintillator is $Tl_aA_bB_c$:yCe, and A is at least one rare earth element selected from trivalent rare earth elements, B is at least one halogen element selected from halogen elements, a is 1, b is 2, and c is 7, a is 2, b is 1, and c is 5, or a is 3, b is 1, and c is 6, and y is equal to or more than 0 and equal to or less than 0.5.

The rare earth element may include at least one of Gd, Y, Lu, Sc, and Ce.

The halogen element may include at least one of Cl, Br, and I.

The matrix material may include thallium halide and rare earth halide.

According to another aspect of the present invention, a method of manufacturing a scintillator includes manufacturing a matrix material including thallium, a rare earth element, and a halogen element, wherein the matrix material does not include an alkaline element as a main substance.

The manufacturing of the matrix material may include mixing thallium halide and rare earth halide at a mole fraction of 1 2, 2 1, or 3 1.

The method may further include doping the matrix material with an activator including cerium halide.

The doping of the matrix material with the activator may include doping the matrix material with cerium halide.

The method may further include growing the matrix material into a single crystal, the growing the matrix material into the single crystal may include descending an ampoule, in which the matrix material is sealed, while heating the ampoule in a Bridgman electric furnace, and the crystal may be grown as the ampoule descends a crystal growth part in the Bridgman electric furnace, and a product of a descent speed of the ampoule in the Bridgman electric furnace and a temperature gradient of the crystal growth part in the Bridgman electric furnace may be in a range of 0.05 to 2.0° C./hr.

A scintillator according to another aspect of the present invention includes a matrix material including thallium, at least one alkaline earth metal element, and at least one halogen element.

The scintillator may further include an activator, with which the matrix material is doped, and the activator may include europium.

The scintillator may further include a chemical formula of the scintillator is $Tl_aA_bB_c$:yEu, and A is at least one alkaline earth metal element selected from divalent alkaline earth metal elements, B is at least one halogen element selected from halogen elements, a is 1, b is 2, and c is 5 or a is 1, b is 1, and c is 3, and y is equal to or more than 0 mol % and equal to or less than 50 mol %.

The matrix material may include thallium halide and alkaline earth halide.

The activator may include europium halide.

According to another aspect of the present invention, there is provided a method of manufacturing a scintillator, the method including manufacturing a matrix material including thallium, at least one alkaline earth metal element, and at least one halogen element.

The manufacturing of the matrix material may include mixing thallium halide and alkaline earth halide at a mole fraction of 1 2 or 1 1.

The method may further include doping the matrix material with an activator.

The doping the matrix material with the activator may include doping the matrix material with europium halide.

The method may further include growing the matrix material into a single crystal, the growing the matrix material into the single crystal may include descending an ampoule, in which the matrix material is sealed, while heating the ampoule in a Bridgman electric furnace, and the crystal may be grown as the ampoule descends a crystal growth part in the Bridgman electric furnace and a product of a descent speed of the ampoule in the Bridgman electric furnace and a temperature gradient of the crystal growth part in the Bridgman electric furnace is in a range of 0.05 to 2.0° C./hr.

Other aspects, advantages, and salient features of the disclosure will become apparent to those skilled in the art from the following detailed description, which, taken in conjunction with the annexed drawings, discloses various embodiments of the present disclosure.

According to embodiments of the present invention, a new material scintillator having a high detection efficiency for radioactive rays, a high optical yield, and excellent fluorescent damping time characteristics, a method for manufacturing the same, and an application thereof are provided.

Further, according to embodiments of the present invention, an advanced material scintillator having excellent scintillation characteristics, such as a high detection efficiency for radioactive rays while taking Tl having a high atomic number of 81 as a matrix material and a high optical yield by doping Eu with an activator are provided.

The effects of the prevent invention are not limited the above-mentioned ones. Unmentioned effects will be clearly understood from the specification and the accompanying drawings by those skilled in the art to which the present invention pertains.

DETAILED DESCRIPTION

Figure 1A:
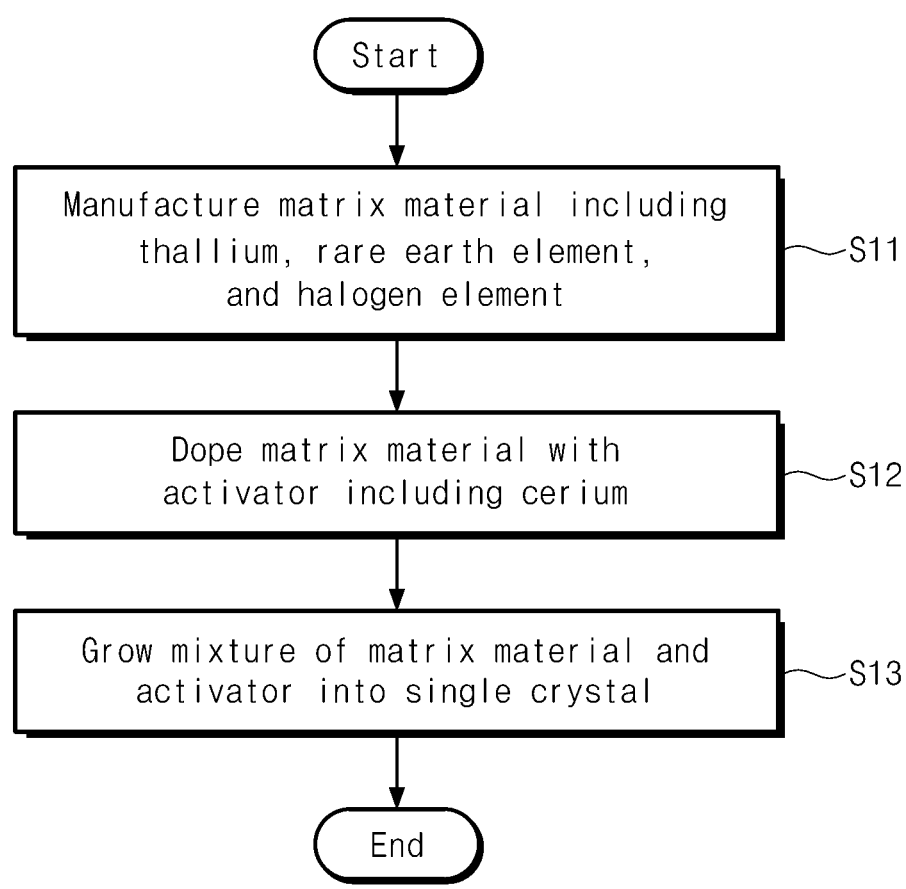
FIG. 1A is a flowchart of a method for manufacturing a scintillator according to an embodiment of the present invention.

The above and other aspects, features and advantages of the invention will become apparent from the following description of the following embodiments given in conjunction with the accompanying drawings. However, the present invention is not limited to the embodiments disclosed below, and the present invention is defined by the scope of the claims. Although not defined, all the terms (including technical or scientific terms) used herein may have the same meanings that are generally accepted by the common technologies in the field to which the present invention pertains. A general description of the known configurations may be omitted not to make the essence of the present invention obscure. In the drawings of the present invention, the same reference numerals are used to denote the same or similar configurations if possible. For easy understanding of the present invention, some configurations may be rather exaggerated or downscaled in the drawings.

The terminologies used herein are provided only to describe specific embodiments, and are not intended to limit the present invention. The terms of a singular form may include plural forms unless otherwise specified. The terms "including" and "having" are used to designate that the features, the numbers, the steps, the operations, the elements, the parts, or combination thereof described in the specification are present, and may be understood that one or more other features, numbers, step, operations, elements, parts, or combinations thereof may be added.

The present invention relates to a thallium rare earth halide scintillation crystal doped with an activator (for example, cerium) based on a matrix material (parent body material) including thallium (Tl), rare earth elements (Gd, Lu, Y, Sc, and Ce), halogen elements and in which an alkaline element is not contained as a main substance. A process of making a single crystal of a scintillator based on thallium is a process that requires a very difficult and high level technology. The inventor(s) succeeded in developing an advanced material scintillator having excellent characteristics based on thallium and obtaining a single crystal through long-term studies and experiments. The inventor(s) could manufacture an advanced scintillator material that has never been present until now, through a growth temperature (melt temperature) condition and a crystal growth condition (a correlation between a descent speed of an ampoule and a temperature gradient of a crystal growth part) of the scintillator.

The scintillator according to an embodiment of the present invention is a scintillating material, the chemical formula is Tl$_a$A$_b$B$_c$:yCe. A is at least one rare earth element selected from the group including Gd, Lu, Y, Sc, and Ce, B is at least one halogen element selected from the group including Cl, Br, and I. The mole fraction a:b:c of thallium, a rare earth element, and a halogen element may be 1:2:7, 2:1:5 or 3:1:6. y is a mole fraction (concentration) of ions of an activator (Ce) that is doped with impurities to generate a scintillation phenomenon, and may have a value of more than 0 and not more than 50 mol % for a proper amount of scintillation.

The scintillator according to an embodiment of the present invention may be manufactured through a process of manufacturing a matrix material by mixing thallium halide and rare earth halide at a mole fraction of 1:2, 2:1, or 3:1, and doping the matrix material with an activator including cerium halide and growing the matrix material into a single crystal. As a result of many experiments and trials and errors, the inventor(s) could come to know that a descent speed of an ampoule and a temperature gradient of a crystal growth part complexly influence the growth of crystals significantly when the mixture of the matrix material and the activator are grown into a single crystal, and a growth condition of the crystal growth part, that is, a melt temperature and a product of a descent speed of an ampoule and a temperature gradient of the crystal growth part has to be set to a specific range to grow the mixture of a thallium-based matrix material and an activator into a single crystal.

In an embodiment of the present invention, it is preferable that the product of the descent speed of the ampoule and the temperature gradient of the crystal growth part is set to a range of 0.05~2.0° C./hr, and this is because productivity is bad when the product of the descent speed of the ampoule and the temperature gradient of the crystal growth part is less than 0.05° C./hr, and crystals are broken or crystal characteristics deteriorate when the product of the descent speed of the ampoule and the temperature gradient of the crystal growth part is more than 2.0° C./hr so that an amount of scintillation and fluorescent damping time characteristics deteriorate. Further, it is preferable that the melt temperature of the mixture of the matrix material and the activator is set to a range of 550 to 750° C. Then, the melt temperature may be properly adjusted according to a rare earth element or a halide element. When the melt temperature of an oxide scintillator according to the related art is generally 1,000 to 2,000° C. or higher, the scintillator according to the embodiment has an advantage of reducing process costs because a scintillator may be grown in a low melt temperature condition of 650° C. or less.

The scintillator according to the embodiment may be utilized in various application fields for detecting radioactive rays. The radioactive ray detection efficiency is determined according to an interaction between the input radioactive ray and the scintillator detector. It is a photoelectric effect that is most important in detection efficiency when an X-ray is detected, and because the photoelectric effect is proportional to the third to fifth power of the atomic number of the scintillator material, a detection efficiency for an X-ray or a gamma ray rapidly increases as the atomic number of the material becomes higher. Accordingly, the present invention developed an advanced scintillator having a high detection efficiency for a radioactive ray, in particular, an X-ray or a gamma ray based on thallium having an atomic number of 81.

The optical yield is a value related to the strength of a detection signal generated when the scintillator detects a radioactive ray, and because a signal to noise ratio (SNR) increases as the optical yield becomes higher, an excellent measurement result may be obtained with a small amount of rays. In particular, an exposure dose of a human body may be reduced when the scintillator is used as an image sensor for medical radioactive rays. The elements that determine an optical yield of the scintillator include the kind and the concentration of doped impurities, and crystal characteristics and transparency of the single crystal. In the scintillator, particularly, the crystal characteristics and transparency of the scintillator is a very important element. Generally, a material of a high atomic number has a low transparency, but according to the present invention, a scintillator having a transparency that shows an excellent optical yield may be developed by optimizing the kinds, the mole fractions, the crystal growth conditions, and the atmospheres of a main substance that forms the matrix material of the scintillator and the activator doped as impurities.

When the crystal structure of the scintillation crystal is a monoclinic system or a hexagonal system or a growth temperature of the crystal structure is high, it is difficult to grow a single crystal of a high quality, the price of the scintillation crystal is high, and a single crystal is broken easily to a specific crystal surface even though the single crystal is grown. Further, damping time characteristics may be longer because of emission of light due to self-trap excitation if the crystal characteristics and transparency deteriorate, and an output signal decreases because the emitted light generated by radioactive rays is absorbed in the scintillator. Accordingly, it is preferable that a crystal structure, such as a tetragonal system or a hexagonal system, which is advantageous for growth of crystals is selected when a single crystal is grown. Further, it is very important to optimize a crystal growth condition. All combinations of elements are not grown to a single crystal, and a process of making a single crystal having excellent scintillation characteristics is a process that is very difficult and requires a high level technology even though they are materials that are grown to a single crystal.

Further, in the case of scintillators, the characteristics of a scintillator, such as light emission wavelength or light emission time, appears very differently according to the kinds of other components constituting the matrix material or a fine difference of the matrix material or the doping materials. The matrix material of the scintillator according to the embodiment does not include an alkaline element as a main element, and the process condition of the scintillator, in which a scintillation crystal of a sufficient size may be grown, is different from that of an existing scintillator including an alkaline element and the characteristics of the scintillators are totally different. The main substance in the specification refers to a substance that is intentionally added to grow a single crystal of a scintillator, except for impurities that are inevitably mixed in a scintillator single crystal growing process.

Based on many trials and errors, experiences, and theories, after selecting candidate elements through the radius of ions, the atomic numbers, and the melting points of the atoms, and the phase diagram, the X-ray diffraction (XRD), and the differential thermal analysis (DSC) of the crystal, the inventor(s) succeeded in developing a halide scintillation crystal based on thallium rare earth having excellent scintillation characteristics through experiments using various combinations of elements and established crystal growth conditions, such as a temperature condition, an atmosphere, and a crystal growth speed when the scintillation crystal is grown. In the X-ray diffraction analysis result, it was identified that the developed crystal of the scintillator is an advanced material that is not present in an XRD database.

The fluorescent damping time characteristics of the scintillator are determined according to energy transition characteristics of an energy band level of a matrix material material and an energy level of doping impurities functioning as the center of emitted light. Many rare earth elements are used as doping impurities functioning as the center of emitting light, and a material in which the energy level of doping impurities and the energy level of a matrix material of a scintillator are well matched and energy may be well transited between the two energy levels has to be selected. In particular, fluorescent damping time characteristics are very important elements in application fields, such PET, which requires quick time characteristics. Further, because the wavelength of the emitted light is related to an energy level of doped impurities, it is required to select a material that is well suitable for photon efficiency characteristics of a photoelectron multiplier or a photodiode that is a passive element. Accordingly, thallium, a rare earth element, or a halogen element was selected as a main substance of the base, and cerium ions were selected as doping impurities. Cerium ions have a relatively high optical yield and quick time characteristics through a transition of 4f->5d, and the energy level of the cerium ions is well matched with the energy level of $Tl_aA_bB_c$ that is used as the matrix.

The thallium rare earth based halide scintillator according to the present invention has a high atomic number and a high optical yield, and in particular, the scintillator has a high detection efficiency for X-rays or gamma rays, has excellent fluorescent damping time characteristics, easily grows a single crystal, and reduces an exposure dose for a human body when being utilized in a medical image field. Accordingly, the scintillator according to the embodiment may be utilized as an advance material scintillator for various medical radioactive ray images, such as CT, PET, SPECT, and a gamma camera, and may be utilized as a radioactive ray sensor for various industrial fields. In particular, the scintillator according to the embodiment of the present invention may be applied to a field, such as a positron emitting tomography device, which requires quick damping time characteristics because it has a short fluorescent damping time.

FIG. 1A is a flowchart of a method for manufacturing a scintillator according to an embodiment of the present invention. Referring to FIG. 1A, a method for manufacturing a scintillator according to an embodiment may include a step of manufacturing a matrix material including thallium, at least one rare earth element, and at least one halogen element (S110), a step of doping the matrix material with an activator including cerium (S12), and a step of, sealing a mixture of the matrix material and the activator in a quartz ampoule in a vacuumed state, growing the sealing ampoule into a single crystal of a scintillator in a Bridgman electric furnace (S13). Then, an end of the quartz ampoule, in which a sample is contained, may be machined to be sharp in advance such that a seed crystal of the single crystal, which will be grown in the Bridgman electric furnace is easily generated. When a single crystal is grown through a Bridgman method, a temperature of a single crystal growth point, a temperature gradient, and a descent speed of the sample is very important and the temperature of the single crystal growth point is closely related to a melt temperature of the sample. The inventor(s) identified through experiments that it is effective in growing a single crystal of a scintillator based on thallium having excellent characteristics to make a product of the descent speed of the ampoule and the temperature gradient of the crystal growth part 0.05~2.0° C./hr.

Figure 1B:
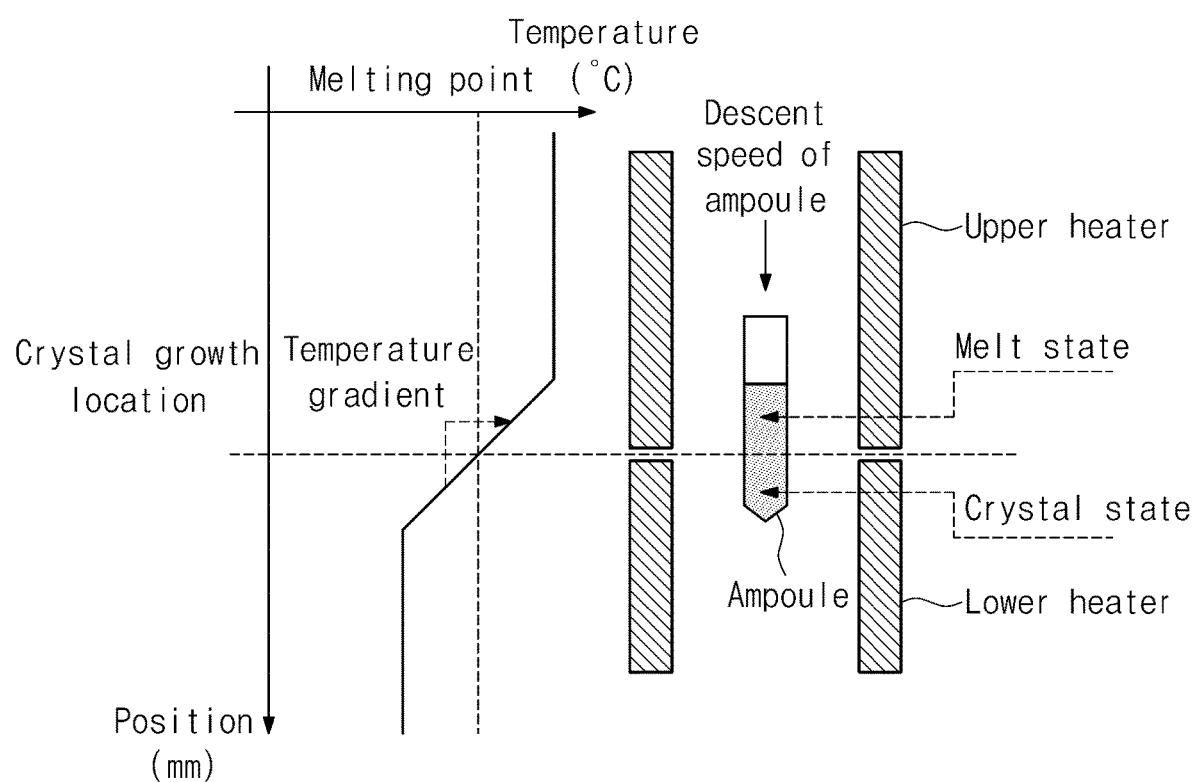
FIG. 1B is a schematic view of a Bridgman electric furnace for explaining a single crystal growth condition of a scintillator according to an embodiment of the present invention.

FIG. 1B is a schematic view of a Bridgman electric furnace for explaining a single crystal growth condition of a scintillator according to an embodiment of the present invention. Referring to FIG. 1B, an upper heater is disposed on the upper side of a lower heater to heat the ampoule at a first temperature that is higher than a melting temperature (melting point) (for example, 550 to 750° C.). determined according to the material of the scintillator. The lower heater is disposed on the lower side of the upper heater to heat the ampoule at a second temperature that is lower than the melting temperature of the material of the scintillator.

The heating temperatures of the upper heater and the lower heater may be set such that the temperature of the crystal growth location becomes the melting temperature of the material of the scintillator and the product of the descent speed of the ampoule and the temperature gradient of the crystal growth part becomes 0.05 to 2.0° C./hr. Then, the crystal growth location of the scintillator may be formed at a location between the upper heater and the lower heater. In the embodiment of the present invention, the temperature gradient of the crystal growth part may mean a value obtained by measuring a ratio (rate) of a change of the temperature with respect to a change of the location of the crystal growth location.

In an aspect of productivity, it is preferable that the descent speed of the ampoule is set to 0.1 mm/hr or higher. Then, although being different according to the descent speed of the ampoule, the product of the descent speed of the ampoule and the temperature gradient of the crystal growth part may be set to 0.05~2.0° C./hr and the temperature gradient of the crystal growth part may be set to a range of 30° C./cm or lower. In the embodiment of the present invention, the melt temperature may be 550 to 750° C. The melt temperature is a temperature that is much lower than a melt temperature for growing scintillators used in the related art, and according to the present invention, the costs may be remarkably lowered when a scintillator is manufactured because a single crystal may be grown at a low temperature of 550 to 750° C.

Embodiment 1

A thallium rare earth halide ($Tl_aGd_bCl_c$:yCe) scintillation crystal was manufactured by doping a matrix material of thallium halide (TlCl) and 3 trivalent rare earth halide ($GdCl_3$) with cerium. In order to manufacture a thallium rare earth halide scintillator, after thallium halide and rare earth halide are mixed at a mole fraction of 1:2 and a specific amount of cerium chloride is mixed, it was sealed in a quartz ampoule into a vacuum state of about $10^{-5}$ torr. The scintillator was manufactured by making the mole fraction of cerium chloride ($CeCl_3$) 0, 1 mol % with respect to the mole fraction of thallium. The sealed quartz ampoule was grown to a thallium rare earth halide ($TlGd_2Cl_7$:yCe) scintillator in a Bridgman electric furnace. Then, a crystal growth condition of a product of the descent speed of the ampoule and the temperature gradient of the crystal growth part was 0.05~2.0° C./hr.

When a single crystal is grown through a Bridgman method, the temperature and the temperature gradient of a single crystal growth point, and the descent speed of the sample are very important. The temperature of the single crystal growth point has a close relationship with the melt temperature of the sample. Because a single crystal of a $TlGd_2Cl_7$:yCe scintillator is grown at a low temperature as compared with generally used scintillators, costs may be remarkably reduced when the scintillator is manufactured. The quartz ampoule containing a sample was machined such that a seed crystal of a single crystal that will be grown may be easily generated by making one end of the quartz ampoule sharp. The grown single crystal was cut into a specific size and all the sections thereof were polished on polishing cloth by using aluminum oxide ($Al_2O_3$) to investigate scintillation characteristics.

A relative optical yield and a fluorescent damping time at a room temperature were measured by a pulse height analysis system using RBCs photoelectron multiplier (Electron tube Ltd. D726Uk). A signal exiting from the photoelectron multiplier was analyzed by using a ROOT program after being amplified by using an amplifier (×10, ×100) manufactured directly by the inventor(s) and passing through a 400 MHz flash analog to digital converter (FADC) and a field programmable gate array (FPGA) was used as a trigger.

Figure 2:
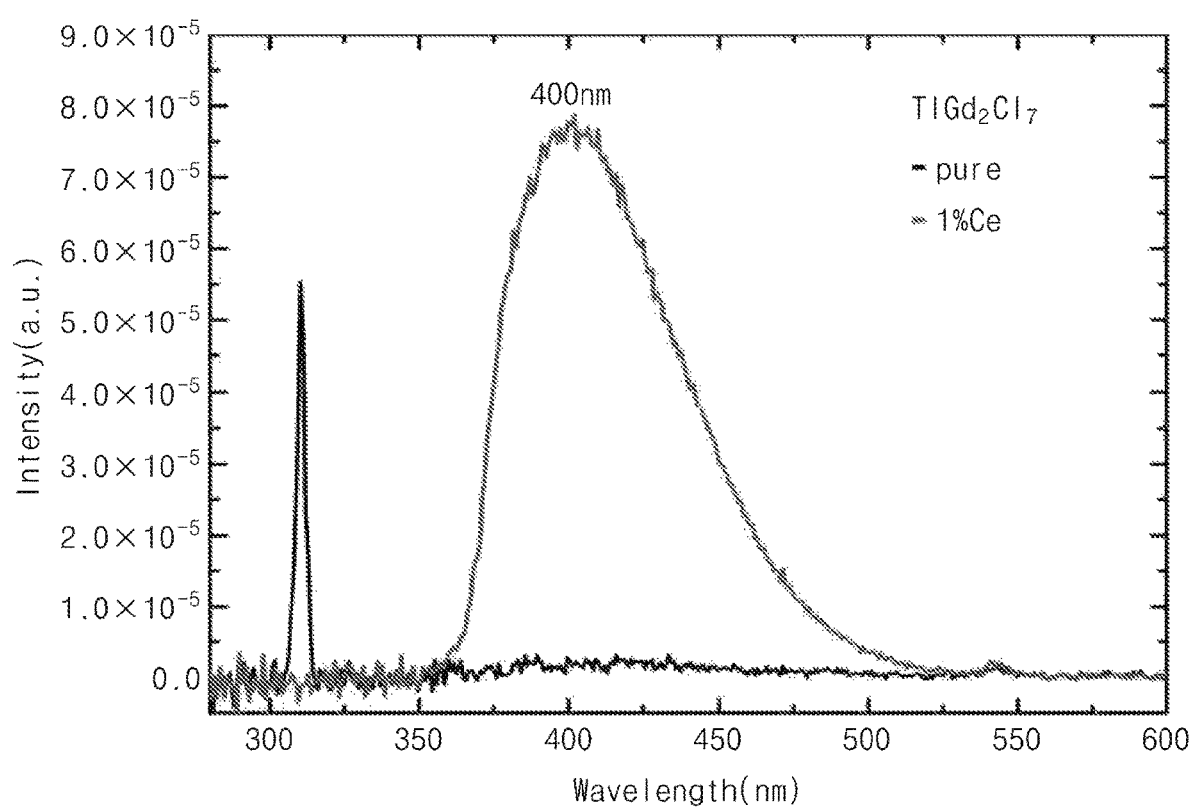
FIG. 2 is a graph depicting a light emission spectrum of a $TlGd_2Cl_7$:$Ce_{0.01}$ scintillator according to an embodiment of the present invention.

FIG. 2 is a graph obtained by measuring a light emission spectrum of a $TlGd_2Cl_7$:$Ce_{0.01}$ scintillator according to an embodiment of the present invention in a range of 300 to 600 nm by using a spectroscopy. The concentration of cerium ions added as an activator was changed to 0.1 mol %. Optical yield appeared to be highest when the concentration cerium is 1 mol %. The range of the wavelength of the emitted light of the scintillator was 350 to 500 nm and the peak wavelength was 400 nm for an X-ray regardless of the concentration of the activator, and the result well coincide with the photon efficiency characteristics of a commercial photodiode and a photoelectron multiplier.

Figure 3:
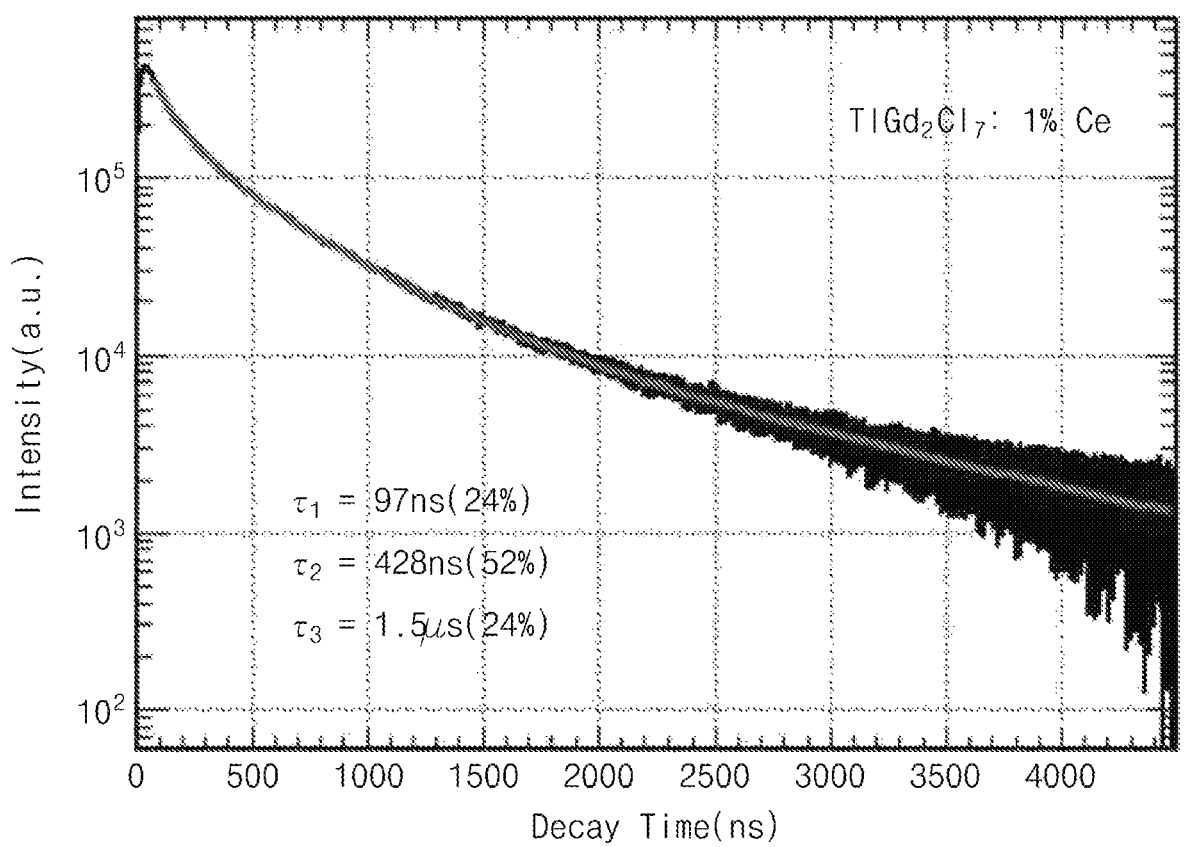
FIG. 3 is a graph depicting fluorescent damping time characteristics for a $^{137}Cs$ 662 keV gamma ray of a $TlGd_2Cl_7$:$Ce_{0.01}$ scintillator according to an embodiment of the present invention.

FIG. 3 is a graph evaluating fluorescent damping time characteristics for a $^{137}Cs$ 662 keV gamma ray of a $TlGd_2Cl_7$:$Ce_{0.01}$ scintillator according to an embodiment of the present invention. Referring to FIG. 3, a fluorescent damping time of a $TlGd_2Cl_7$:$Ce_{0.01}$ scintillator includes three time components, and the quickest time component is 97 ns and occupies 24% of the entire fluorescence, the middle time component is 428 ns and occupies 52%, and the slowest time component is 1.5 µs and occupies about 24% of the entire fluorescence.

Figure 4:
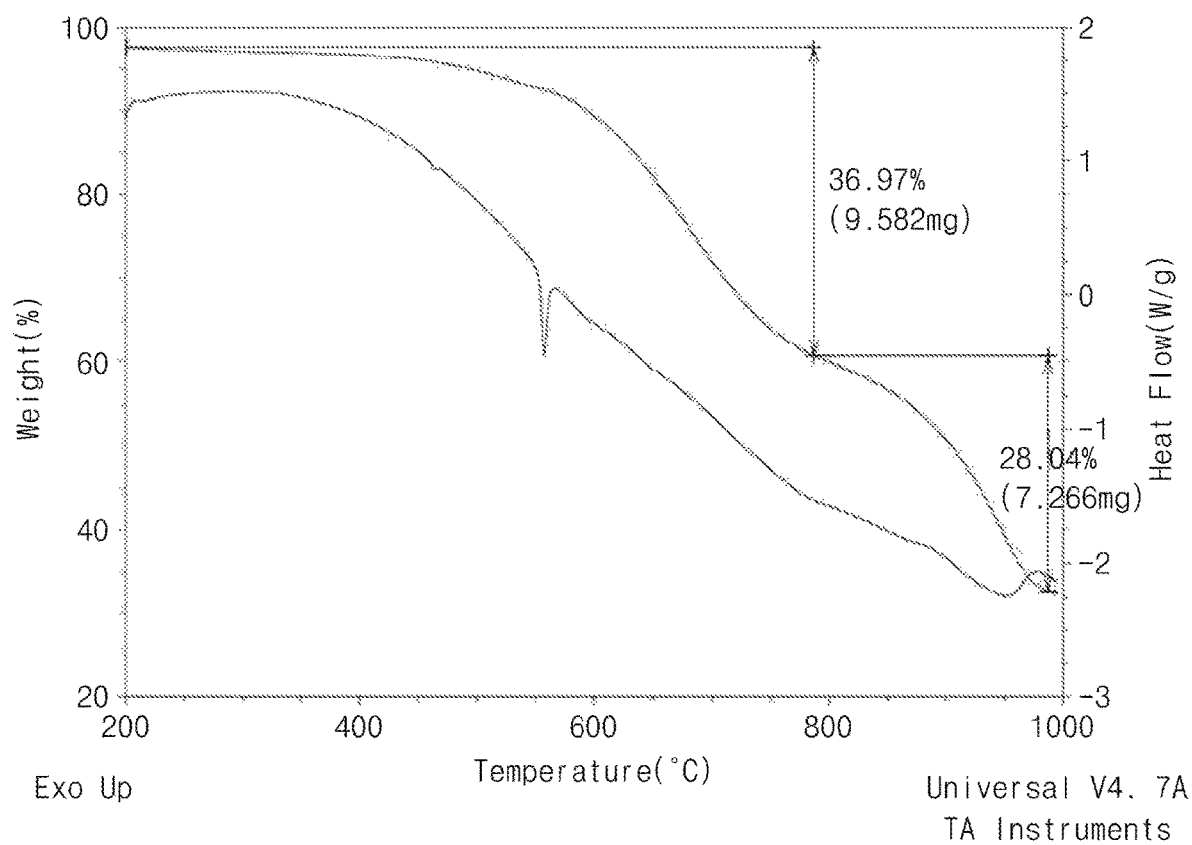
FIG. 4 is a thermal analysis DSG-TGA graph of a $TlGd_2Cl_7$:$Ce_{0.01}$ scintillator according to an embodiment of the present invention.

FIG. 4 is a thermal analysis DSG-TGA graph of a $TlGd_2Cl_7$:$Ce_{0.01}$ scintillator according to an embodiment of the present invention. As can be seen in FIG. 4, an endothermic reaction was observed at around 560° C. and it may be identified that samples mixed with the matrix material react by 100%. This shows that the scintillator of the embodiment was grown to a single crystal.

Embodiment 2

A thallium rare earth halide ($Tl_aCe_bBr_c$) scintillation crystal was manufactured while taking thallium halide (TlBr) and trivalent rare earth halide ($CeBr_3$) as a matrix. In order to manufacture a thallium rare earth halide scintillator, after thallium halide (TlBr) and rare earth halide ($CeBr_3$) are mixed at a mole fraction of 1:2, it was sealed in a quartz ampoule into a vacuum state of about $10^{-5}$ torr. The sealed quartz ampoule was grown to a thallium rare earth halide ($TlCe_2Br_7$) scintillator in a Bridgman electric furnace. Then, a crystal growth condition of a product of the descent speed of the ampoule and the temperature gradient of the crystal growth part was 0.05~2.0° C./hr.

Figure 5:
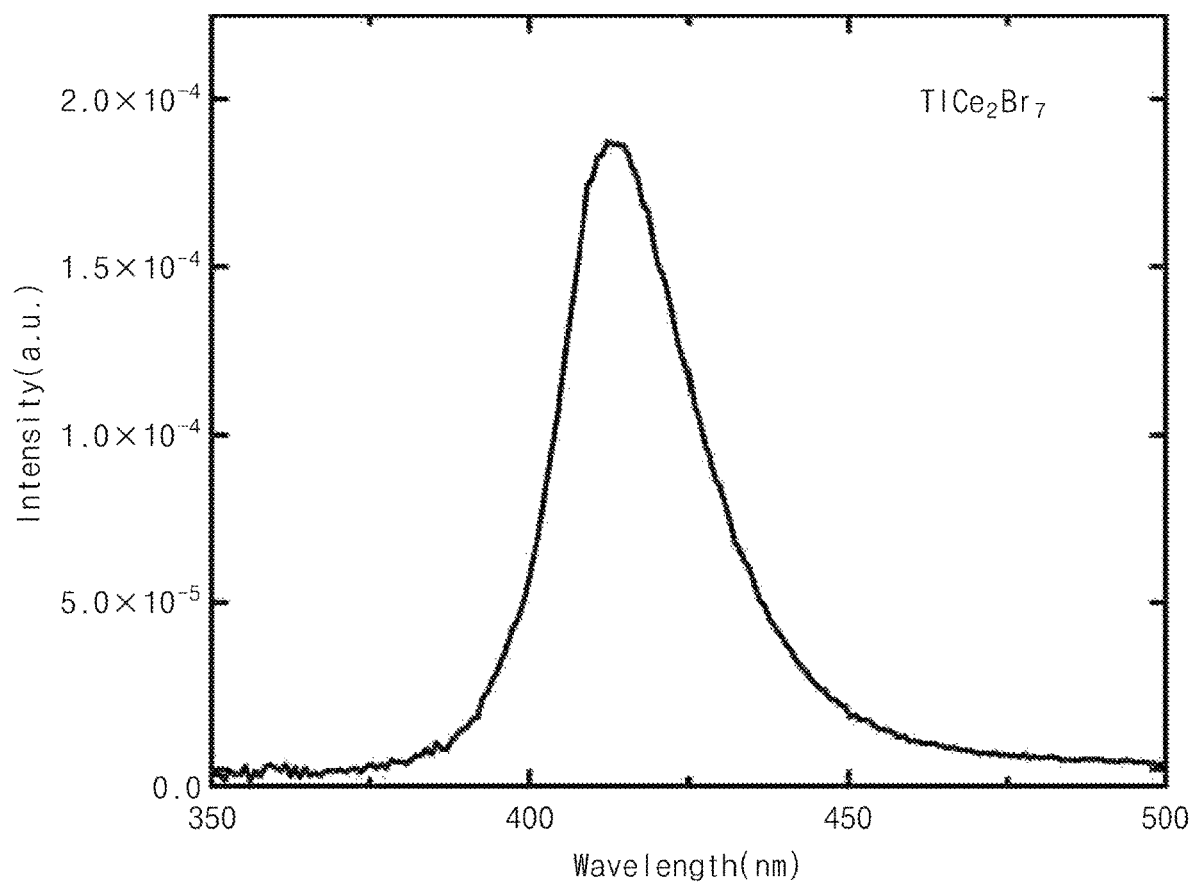
FIG. 5 is a graph depicting a light emission spectrum of a $TlCe_2Br_7$ scintillator according to an embodiment of the present invention.

FIG. 5 is a graph obtained by measuring a light emission spectrum of a TlCe$_2$Br$_7$ scintillator in a range of 350 to 500 nm by using a spectroscopy. The range of the wavelength of the emitted light of the scintillator was 380 to 480 nm and the peak wavelength was 415 nm for an X-ray due to the emission of light by cesium ions used as the matrix, and the result well coincide with the photon efficiency characteristics of a commercial photodiode and a photoelectron multiplier.

Embodiment 3

A thallium rare earth halide (Tl$_a$Y$_b$Cl$_c$:yCe) scintillation crystal was manufactured by doping a matrix material of thallium halide (TlCl) and trivalent rare earth halide (YCl$_3$) with cerium. In order to manufacture a thallium rare earth halide scintillator, after thallium halide and rare earth halide are mixed at a mole fraction of 1:2 and a specific amount of cerium chloride is mixed, it was sealed in a quartz ampoule into a vacuum state of about 10$^{-5}$ torr. The scintillator was manufactured by making the mole fraction of cerium chloride (CeCl$_3$) 0, 1 mol % with respect to the mole fraction of thallium. The sealed quartz ampoule was grown to a thallium rare earth halide (TlY$_2$Cl$_7$:yCe) scintillator in a Bridgman electric furnace. Then, a crystal growth condition of a product of the descent speed of the ampoule and the temperature gradient of the crystal growth part was 0.05~2.0° C./hr, and the melt temperature was 550° C.

When a single crystal is grown through a Bridgman method, the temperature and the temperature gradient of a single crystal growth point, and the descent speed of the sample are very important. The temperature of the single crystal growth point has a close relationship with the melt temperature of the sample. Because a single crystal of a Tl$_a$A$_b$B$_c$:yCe scintillator is grown at a low temperature as compared with generally used scintillators, costs may be remarkably reduced when the scintillator is manufactured. The quartz ampoule containing an example are machined such that a seed crystal of a single crystal that will be grown may be easily generated by making one end of the quartz ampoule sharp. The grown single crystal was cut into a specific size and all the sections thereof were polished on polishing cloth by using aluminum oxide (Al$_2$O$_3$) to investigate scintillation characteristics.

Figure 6:
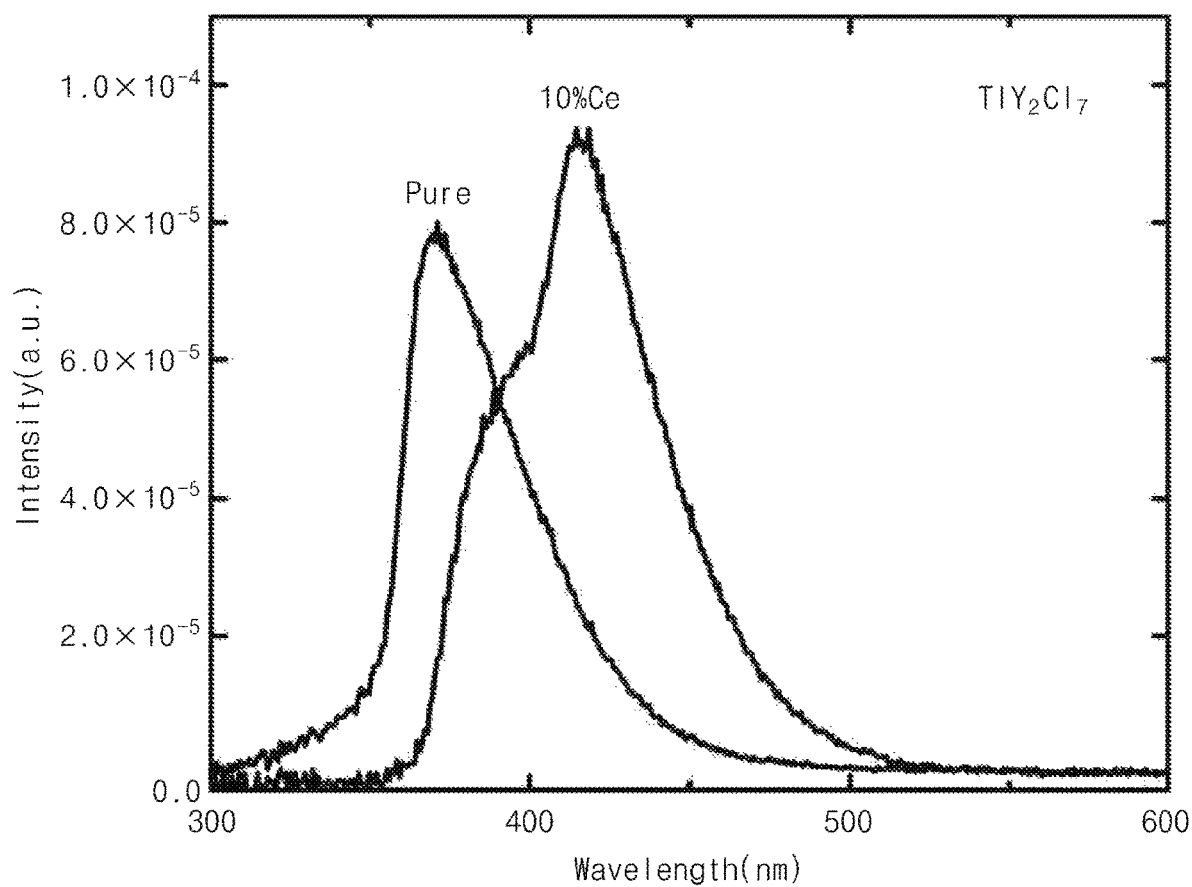
FIG. 6 is a graph depicting light emission spectrums of a $TlY_2Cl_7$ scintillator and a $TlY_2Cl_7$:$Ce_{0.1}$ scintillator according to an embodiment of the present invention.

FIG. 6 is a graph obtained by measuring light emission spectrums of a TlY$_2$Cl$_7$ scintillator and a TlY$_2$Cl$_7$:Ce$_{0.1}$ scintillator in a range of 300 to 600 nm by using a spectroscopy. The concentration of cerium ions added as an activator was changed to 0, 10 mol %. When cerium was not added as an activator, the range of the wavelength of the emitted light of the scintillator for an X-ray was 300 to 470 nm and the peak wavelength was 365 nm. When cerium ions of 10 mol % was added as an activator, the range of the wavelength of the emitted light of the scintillator for an X-ray was 360 to 520 nm and the peak wavelength was 420 nm. As the cerium ions are doped, the range of the wavelength of the emitted light moves to a long wavelength, which well coincides with the positron efficiency characteristics of a common photodiode and a photoelectron multiplier.

As an application example of a scintillator, a positron emission tomography (PET) device has to have a high gamma detection efficiency and high scintillation output characteristics of a scintillator radioactive ray sensor to reduce an exposure dose of the patient and obtain a meaningful radioactive image, and has to have quick fluorescent damping time characteristics because two gamma rays generated by a pair annihilation of a positron have to be measured at the same time. The optical yield of the scintillator according to the embodiment was two times as high as that of a common LYSO (Lu$_{2(1-x)}$Y$_{2x}$SiO$_5$:Ce) scintillator, and the scintillator showed relatively quick characteristics of a fluorescent damping time of 97 ns when the concentration of Ce ions is 1 mol %. From the above-mentioned characteristics, it can be seen that the scintillator according to the embodiment of the present invention is useful in a single photon emission tomography device and a positron emission tomography device. Because the light emission wavelength area well coincides with the photon efficiency characteristics of a photodiode, a photodiode instead of a photoelectron multiplier may be utilized as a light receiving element. Because a PET sensor may be miniaturized by using a photodiode, a location resolution may be improved when the PET sensor is used as a radioactive image sensor.

Lu-based scintillators (LSO, Lu$_2$SiO$_5$:Ce) (LYSO, Lu$_{2(1-x)}$Y$_{2x}$SiO$_5$:Ce) used as PET scintillators have high densities and effective atomic numbers and short fluorescent damping times, but it is difficult to grow a single crystal because a crystal growth temperature is very high, energy resolution characteristics are bad, and there exists a background radioactive ray by natural radioisotopes. GSO (Gd$_2$SiO$_5$:Ce) has a low optical yield, bad energy resolution characteristics, and a high crystal growth temperature.

The scintillator according to an embodiment of the present invention takes thallium as a matrix, and because the atomic number of thallium is a very high number of 81, the detection efficiency of thallium for an radioactive ray, such as an X-ray, a gamma ray, an ultraviolet ray, an alpha ray, or a beta ray is high so that an exposure dose for a human body may be reduced when the scintillator is used in a medical field. Further, manufacturing costs of the scintillator may be reduced because a scintillation crystal growth temperature is low and the number of elements is small so that a single crystal may be easily grown, and the scintillator may be applicable in a field, such as a positron emission tomography device, which requires quick time characteristics because fluorescent damping time is short.

Further, the scintillator according to the embodiment may be used in computed tomography (CT), positron emission tomography (PET), single photon emission computed tomography (SPECT), or an anger camera because the light emission wavelength range thereof is well matched with photon efficiency characteristics of a photodiode and the scintillator has a quick fluorescent damping time and a high optical yield. In particular, the embodiment of the present invention is suitable for positron emission tomography (PET) because the scintillator has a short fluorescent damping time and a high optical yield. Further, the scintillator material may be used for a radioactive ray sensor for measuring radioactive rays of various kinds, such as an ultraviolet ray, an electron ray, alpha particles, and beta particles.

On the other hand, the present invention discloses a thallium alkaline earth halide (Tl$_a$A$_b$B$_c$:yEu) scintillation crystal doped with an activator (for example, europium) based on thallium (Tl), an alkaline earth metal element (Ca, Ba, or Sr), or a halogen element (Cl, Br, or I). A process of making a single crystal of a scintillator based on thallium is a process that is very difficult to perform and requires a high level technology, and the inventor(s) succeeded in developing an advance material scintillator having excellent characteristics based on thallium and alkaline earth metal elements and growing the scintillator into a single crystal through long-term studies and experiments.

The inventor(s) could manufacture an advanced scintillator material that has never been present until now, through a growing temperature (melt temperature) condition and a crystal growth condition (a correlation between an ampoule descent speed and a temperature gradient of a crystal growth part) of the scintillator. The scintillator according to the embodiment of the present invention is a scintillation material, of which the chemical formula is $Tl_aA_bB_c$:yEu, and here, A is at least one alkaline earth metal element selected from the group including Ca, Ba, and Sr and B is at least one halogen element selected from the group including CI, Gr, and I. The mole fraction a:b:c of thallium, an alkaline earth metal element, and a halogen element may be 1:2:5 or 1:1:3. y is a mole fraction (concentration) of ions of an activator (Eu) that is doped with impurities to generate a scintillation phenomenon, and may have a value of more than 0 and not more than 50 mol % for a proper amount of scintillation.

The scintillator according to an embodiment of the present invention may be manufactured through a process of manufacturing a matrixmatrix material by mixing thallium halide and alkaline earth halide at a mole fraction of 1:2 or 1:1, and doping the matrix material with an activator including europium halide and growing the matrix material into a single crystal. As a result of many experiments and trials and errors, the inventor(s) could come to know that an ampoule descent speed and a temperature gradient of a crystal growth part complexly influence the growth of crystals significantly when the mixture of the matrix material and the activator are grown into a single crystal, and a growth condition of the crystal growth part, that is, a melt temperature and a product of an ampoule descent speed and a temperature gradient of the crystal growth part has to be set to a specific range to grow the mixture of a thallium-based matrix material and an activator into a single crystal.

In an embodiment of the present invention, it is preferable that the product of the ampoule descent speed and the temperature gradient of the crystal growth part is set to a range of 0.05~2.0° C./hr, and this is because productivity is bad when the product of the ampoule descent speed and the temperature gradient of the crystal growth part is less than 0.05° C./hr, and crystals are broken or crystal characteristics deteriorate when the product of the ampoule descent speed and the temperature gradient of the crystal growth part is more than 2.0° C./hr so that an amount of scintillation and fluorescent damping time characteristics deteriorate. Further, it is preferable that the melt temperature of the mixture of the matrix material and the activator is set to a range of 510 to 840° C. Then, the melt temperature may be properly adjusted according to an alkaline earth metal element or a halide element. When the melt temperature of an oxide scintillator according to the related art is generally 1,000 to 2,000° C. or higher, the scintillator according to the embodiment has an advantage of reducing process costs because a scintillator may be grown in a relatively low melt temperature condition.

The scintillator according to the embodiment may be utilized in various application fields for detecting radioactive rays. The radioactive ray detection efficiency is determined according to an interaction between the input radioactive ray and the scintillator detector. It is a photoelectric effect that is most important in detection efficiency when an X-ray is detected, and because the photoelectric effect is proportional to the fourth to fifth power of the atomic number of the scintillator material, a detection efficiency for an X-ray or a gamma ray rapidly increases as the atomic number of the material becomes higher. Accordingly, the present invention developed an advanced scintillator having a high detection efficiency for a radioactive ray, in particular, an X-ray or a gamma ray based on thallium having an atomic number of 81.

The optical yield is a value related to the strength of a detection signal generated when the scintillator detects a radioactive ray, and because a signal to noise ratio (SNR) increases as the optical yield becomes higher, an excellent measurement result may be obtained with a small amount of rays. In particular, an exposure dose of a human body may be reduced when the scintillator is used as an image sensor for medical radioactive rays. The elements that determine an optical yield of the scintillator include the kind and the concentration of doped impurities, and crystal characteristics and transparency of the single crystal. In the scintillator, particularly, the crystal characteristics and transparency of the scintillator are a very important element. Generally, a material of a high atomic number has a low transparency, but according to the present invention, a scintillator having a transparency that shows an excellent optical yield may be developed by optimizing the kinds, the mole fractions, the crystal growth conditions, and the atmospheres of a main substance that forms the matrix material of the scintillator and the activator doped as impurities.

When the crystal structure of the scintillation crystal is a monoclinic system or a hexagonal system or a growth temperature of the crystal structure is high, it is difficult to grow a single crystal of a high quality, the price of the scintillation crystal is high, and a single crystal is broken easily to a specific crystal surface even though the single crystal is grown. Further, damping time characteristics may be longer because of emission of light due to self-trap excitation if the crystal characteristics and transparency deteriorate, and an output signal decreases because the emitted light generated by radioactive rays is absorbed in the scintillator. Accordingly, it is preferable that a crystal structure, such as a tetragonal system or a hexagonal system, which is advantageous for growth of crystals is selected when a single crystal is grown. Further, it is very important to optimize a crystal growth condition. All combinations of elements are not grown to a single crystal, and a process of making a single crystal having excellent scintillation characteristics is a process that is very difficult and requires a high technology even though they are materials that are grown to a single crystal.

Based on many trials and errors, experiences, and theories, after selecting candidate elements through the radius of ions, the atom numbers, and the melting points of the atoms, and the phase diagram, the X-ray diffraction (XRD), and the differential thermal analysis (DSC) of the crystal, the inventor(s) succeeded in developing a halide scintillation crystal based on a thallium alkaline earth metal element having excellent scintillation characteristics through experiments using various combinations of elements and established crystal growth conditions, such as a temperature condition, an atmosphere, and a crystal growth speed when the scintillation crystal is grown. Because the wavelength of the emitted light is related to an energy level of doped impurities, it is required to select a material that is well suitable for photon efficiency characteristics of a photoelectron multiplier or a photodiode. Accordingly, thallium, an alkaline earth metal element, or a halogen element was selected as a main substance of the matrix, and europium ions were selected as doping impurities. The europium ions have a high optical yield through 4f5d transition, and the energy level was well matched with the material used as a matrix.

Because the thallium alkaline earth metal element based halide scintillator according to the present invention easily grows a single crystal, has a high optical yield, and has a main substance of Tl, the atomic number of which is a very high number of 81, it has a high detection efficiency for an X-ray or a gamma ray so that an exposure dose for a human body may be reduced when it is utilized in a medical image field. Accordingly, the scintillator according to the embodiment may be utilized as an advance material scintillator for various medical radioactive ray images, such as CT, PET, SPECT, and a gamma camera, and may be utilized as a radioactive ray sensor for various industrial fields.

Figure 7:
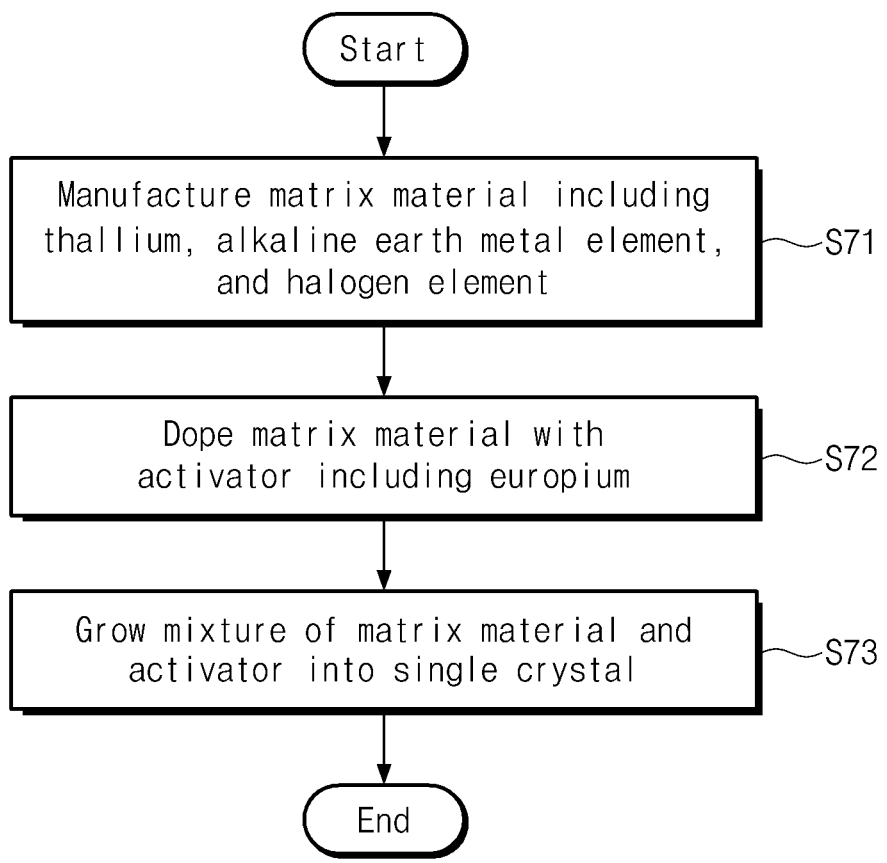
FIG. 7 is a flowchart of a method for manufacturing a scintillator according to an embodiment of the present invention.

FIG. 7 is a flowchart of a method for manufacturing a scintillator according to an embodiment of the present invention. Referring to FIG. 7, a method for manufacturing a scintillator according to an embodiment may include a step of manufacturing a matrix material including thallium, at least one alkaline earth metal element, and at least one halogen element (S71), a step of doping the matrix material with an activator including europium (S72), and a step of, sealing a mixture of the matrix material and the activator in a quartz ampoule in a vacuumed state, growing the sealing ampoule into a single crystal of a scintillator in a Bridgman electric furnace (S73).

Then, an end of the quartz ampoule, in which a sample is contained, may be machined to be sharp in advance such that a seed crystal of the single crystal, which will be grown in the Bridgman electric furnace is easily generated. When a single crystal is grown through a Bridgman method, a temperature of a single crystal growth point, a temperature gradient, and a descent speed of the sample is very important and the temperature of the single crystal growth point is closely related to a melt temperature of the sample. The inventor(s) identified through experiments that it is effective in growing a single crystal of a scintillator based on thallium having excellent characteristics to make a product of the descent speed of the ampoule and the temperature gradient of the crystal growth part.

Referring to FIGS. 1B and 7, in step S73, the upper heater heats the ampoule to a first temperature that is higher than a melting temperature (melting point) (for example, 510 to 840° C.) determined according to the material of the scintillator, and the lower heater heats the ampoule to a second temperature that is lower than the melting temperature of the material of the scintillator. The heating temperatures of the upper heater and the lower heater may be set such that the temperature of the crystal growth location becomes the melting temperature of the material of the scintillator and the product of the descent speed of the ampoule and the temperature gradient of the crystal growth part becomes 0.05 to 2.0° C./hr. Then, the crystal growth location of the scintillator may be formed at a location between the upper heater and the lower heater.

In an aspect of productivity, it is preferable that the descent speed of the ampoule is set to 0.1 mm/hr or higher. Then, although being different according to the descent speed of the ampoule, the product of the descent speed of the ampoule and the temperature gradient of the crystal growth part may be set to 0.05~2.0° C./hr and the temperature gradient of the crystal growth part may be set to a range of 30° C./cm or lower. In the embodiment of the present invention, the melt temperature may be 510 to 840° C. The melt temperature is a temperature that is much lower than a melt temperature for growing scintillators used in the related art, and according to the present invention, the costs may be remarkably lowered when a scintillator is manufactured because a single crystal may be grown at a low temperature of 510 to 840° C.

Embodiment 4

A thallium alkaline earth halide ($Tl_aCa_bCl_c$:yEu) scintillation crystal was manufactured by doping a matrix material of thallium halide (TlCl) and 2 divalent alkaline earth halide ($CaCl_2$) with europium ($EuCl_3$). In order to manufacture a thallium alkaline earth halide scintillator, after thallium halide (TlCl) and alkaline earth halide ($CaCl_2$) are mixed at a mole fraction of 1:2 and a specific amount of europium chloride ($EuCl_3$) is mixed, it was sealed in a quartz ampoule into a vacuum state of about $10^{-5}$ torr. The mole fraction of europium chloride ($EuCl_3$) was 0.5 m %. The sealed quartz ampoule was grown to a thallium alkaline earth halide ($TlCa_2Cl_5$:yEu) scintillator in a Bridgman electric furnace. Then, a crystal growth condition of a product of the descent speed of the ampoule and the temperature gradient of the crystal growth part was 0.05~2.0° C./hr.

When a single crystal is grown through a Bridgman method, the temperature and the temperature gradient of a single crystal growth point, and the descent speed of the sample are very important. The temperature of the single crystal growth point has a close relationship with the melt temperature of the sample. Because a single crystal of a $TlCa_2Cl_5$:yEu scintillator is grown at a low temperature as compared with generally used scintillators, costs may be remarkably reduced when the scintillator is manufactured. The quartz ampoule containing an example are machined such that a seed crystal of a single crystal that will be grown may be easily generated by making one end of the quartz ampoule sharp. The grown single crystal was cut into a specific size and all the sections thereof were polished on polishing cloth by using aluminum oxide ($Al_2O_3$).

Figure 8:
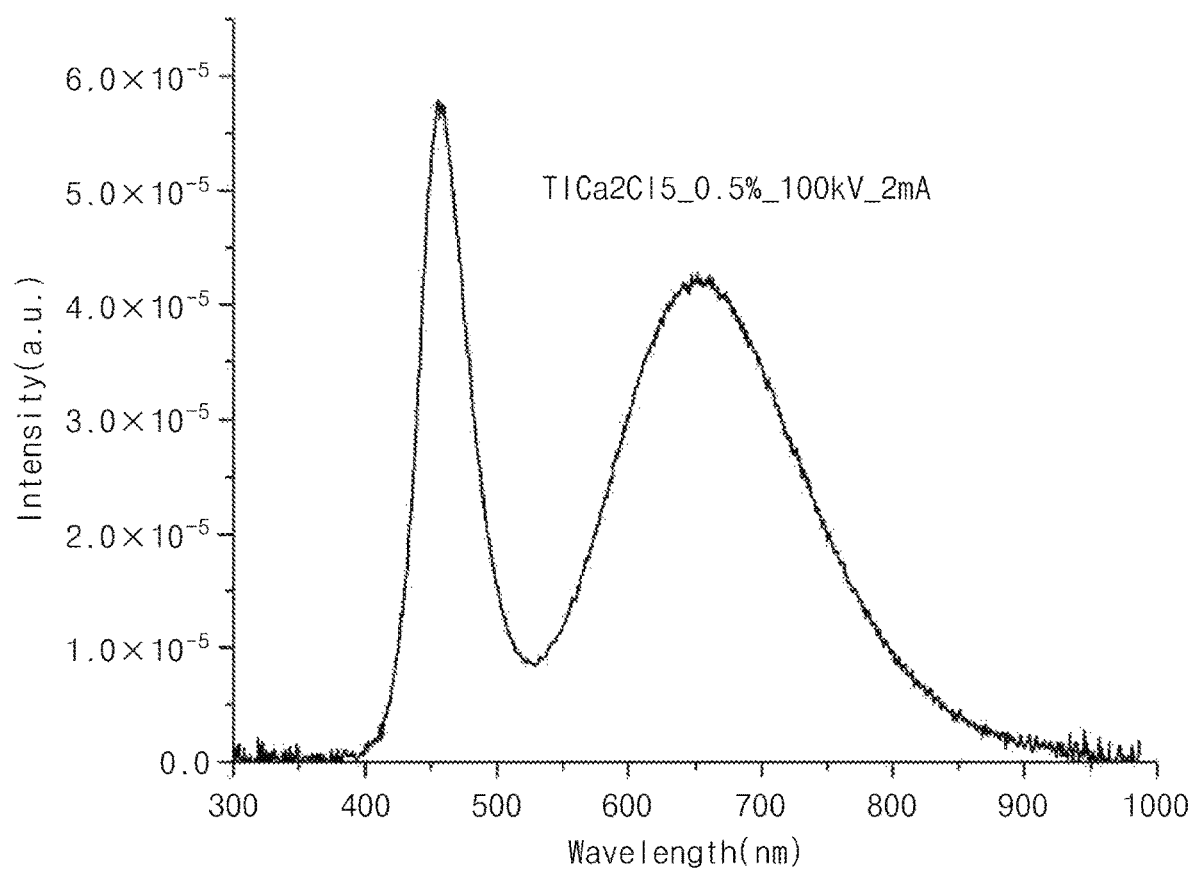
FIG. 8 is a graph depicting a light emission spectrum of a $TlCa_2Cl_5$:$Ce_{0.005}$ scintillator according to an embodiment of the present invention.

FIG. 8 is a graph obtained by measuring a light emission spectrum of a $TlCa_2Cl_5$:$Eu_{0.005}$ scintillator according to an embodiment of the present invention in a range of 300 to 1000 nm by using a spectroscopy. The range of the wavelength of the emitted light for an X-ray of a $TlCa_2Cl_5$:$Eu_{0.005}$ scintillator is 400 to 900 nm and the peak wavelength thereof is 455 nm and 650 nm, which well coincides with the positron efficiency characteristics of the commercial photodiode.

Embodiment 5

A thallium alkaline earth halide ($Tl_aCa_bCl_c$:yEu) scintillation crystal was manufactured by doping a matrix material of thallium halide (TlCl) and 2 divalent alkaline earth halide ($CaCl_2$) with europium ($EuCl_3$). After thallium halide (TlCl) and alkaline earth halide ($CaCl_2$) are mixed at a mole fraction of 1:1 and a specific amount of europium chloride ($EuCl_3$) is mixed, it was sealed in a quartz ampoule into a vacuum state of about $10^{-5}$ torr. The mole fraction of europium chloride ($EuCl_3$) was 0.5 m %. The sealed quartz ampoule was grown to a thallium alkaline earth halide ($TlCaCl_3$:$Eu_{0.005}$) scintillator in a Bridgman electric furnace. Then, a crystal growth condition of a product of the descent speed of the ampoule and the temperature gradient of the crystal growth part was 0.05~2.0° C./hr.

Figure 9:
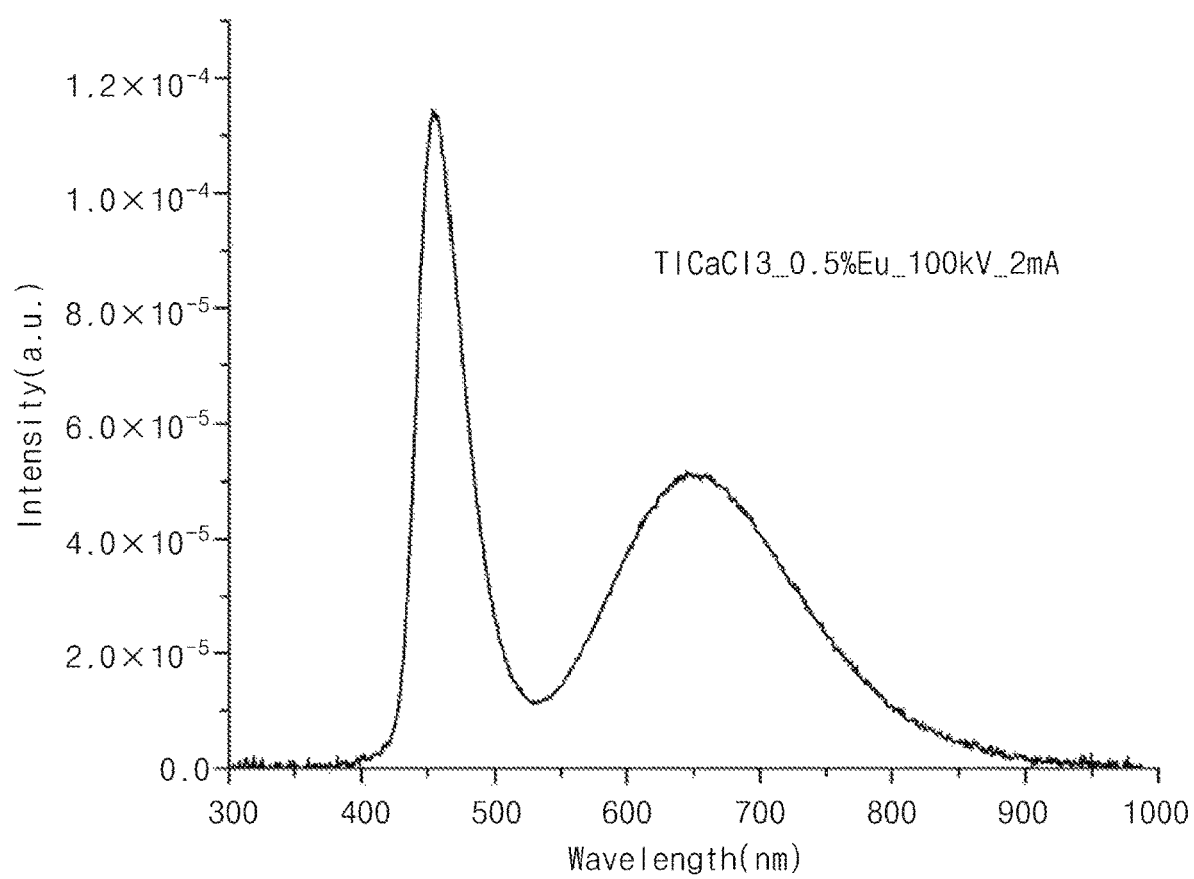
FIG. 9 is a graph depicting a light emission spectrum of a TlCaCl$_3$:Eu$_{0.005}$ scintillator according to an embodiment of the present invention.

FIG. 9 is a graph obtained by measuring a light emission spectrum of a $TlCaCl_3$:$Eu_{0.005}$ scintillator according to an embodiment of the present invention in a range of 300 to 1000 nm by using a spectroscopy. The range of the wavelength of the emitted light for an X-ray of a scintillator for an X-ray is 400 to 900 nm and the peak wavelength thereof is 455 nm and 650 nm, which well coincides with the positron efficiency characteristics of the commercial photodiode.

Embodiment 6

A thallium alkaline earth halide ($Tl_aSr_bBr_c$) scintillation crystal was manufactured while taking thallium halide (TlBr) and divalent alkaline earth halide ($SrBr_2$). After thallium halide (TlBr) and alkaline halide ($SrBr_2$) are mixed at a mole fraction of 1:2, they are sealed in a quartz ampoule at a vacuum state of about $10^{-5}$ torr. The sealed quartz ampoule was grown to a thallium alkaline earth halide ($TlSr_2Br_5$) scintillator in a Bridgman electric furnace. Then, a crystal growth condition of a product of the descent speed of the ampoule and the temperature gradient of the crystal growth part was 0.05~2.0 t/hr.

Figure 10:
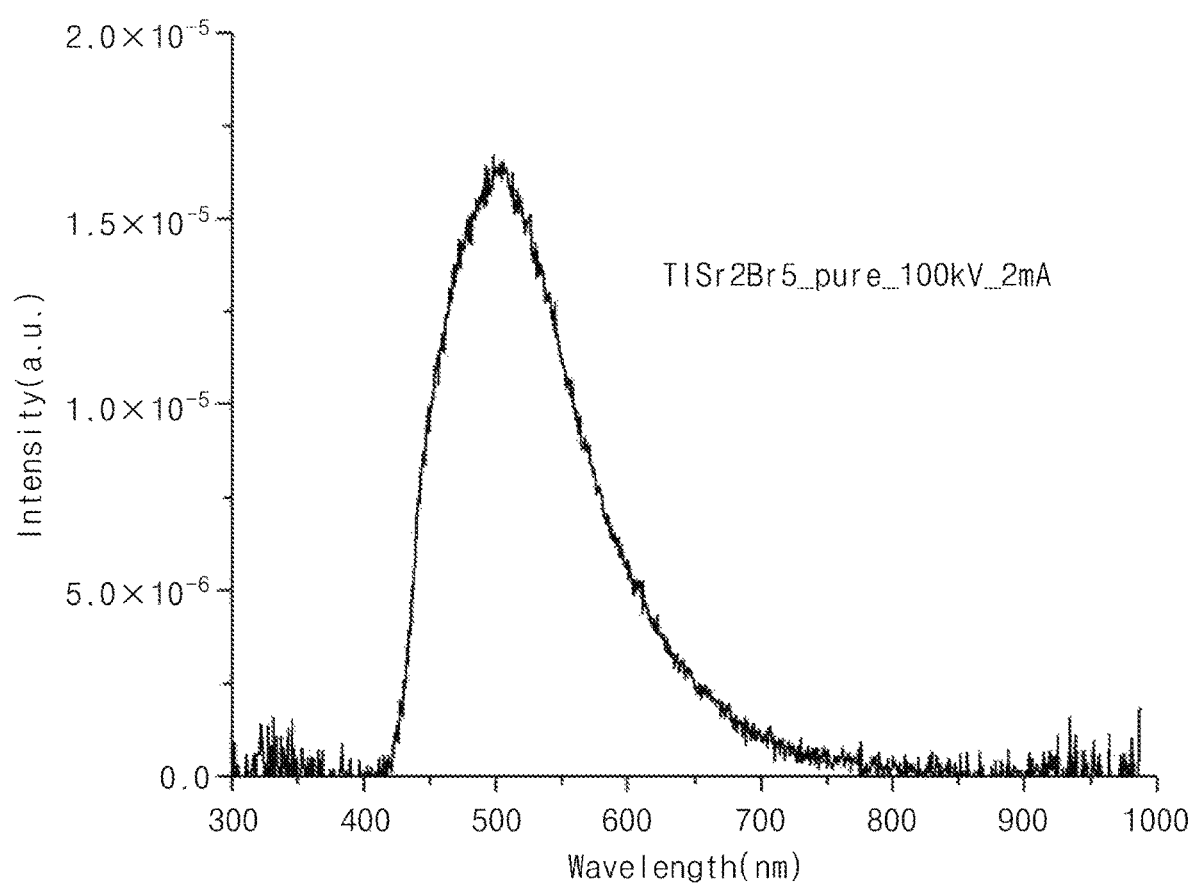
FIG. 10 is a graph depicting a light emission spectrum of a TlSr$_2$Br$_5$ scintillator according to an embodiment of the present invention.

FIG. 10 is a graph obtained by measuring a light emission spectrum of a $TlSr_2Br_5$ scintillator according to an embodiment of the present invention in a range of 300 to 1000 nm by using a spectroscopy. The range of the wavelength of the emitted light for an X-ray of 100 kV for an X-ray is 400 to 800 nm and the peak wavelength thereof is 505 nm, which well coincides with the positron efficiency characteristics of the commercial photodiode.

Figure 11:
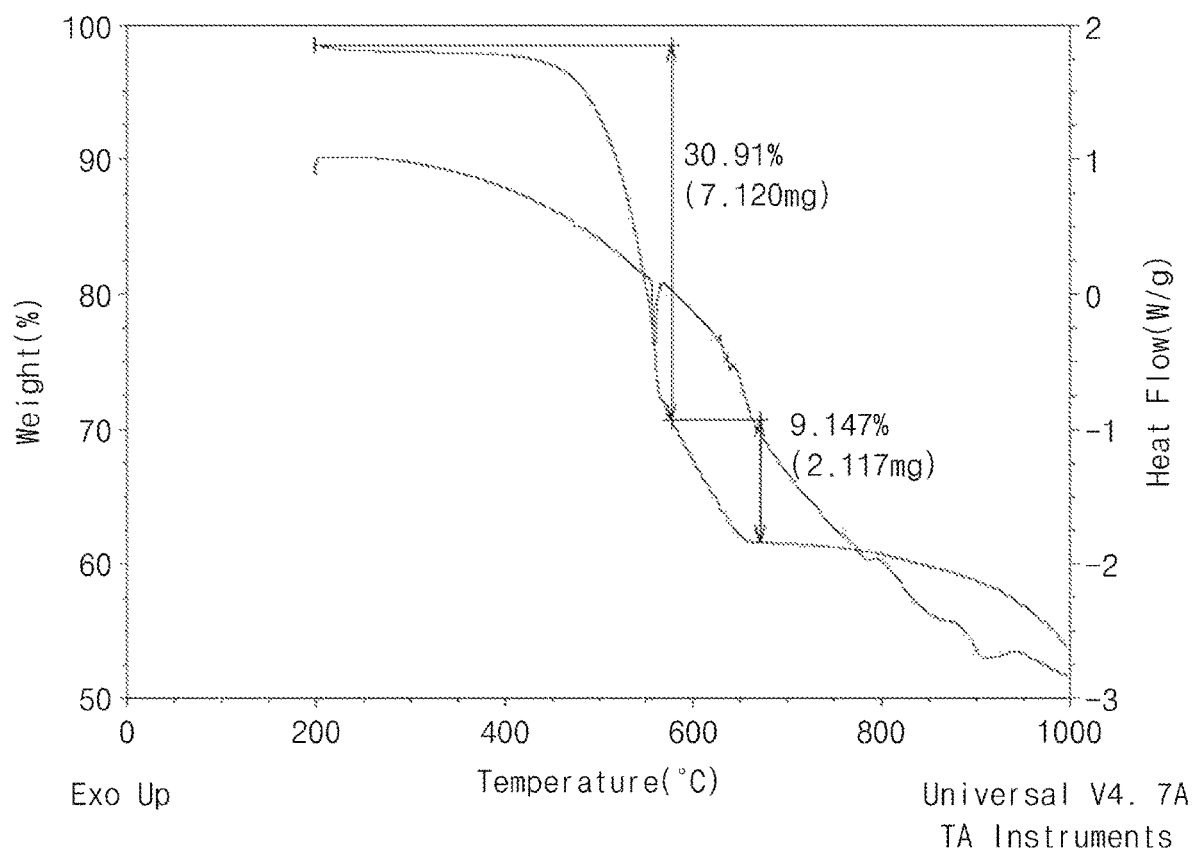
FIG. 11 is a graph depicting a DSC-TGA spectrum of a TlSr$_2$Br$_5$ scintillator according to an embodiment of the present invention.

FIG. 11 is a graph depicting a DSC-TGA spectrum of a $TlSr_2Br_5$ scintillator according to an embodiment of the present invention. Referring to FIG. 11, in the $TlSr_2Br_5$ scintillator, an endothermic reaction was observed at around 550° C., which shows that the scintillator is grown to a single crystal at the corresponding temperature.

Embodiment 7

A thallium alkaline earth halide ($Tl_aSr_bI_c$:yEu) scintillation crystal was manufactured by doping a matrix material of thallium halide (TlCl) and 2 divalent alkaline earth halide ($SrI_2$) with europium ($EuI_3$). After thallium halide (TlCl) and alkaline earth halide ($SrI_2$) are mixed at a mole fraction of 1:2 and a specific amount of europium chloride ($EuI_3$) is mixed, it is sealed in a quartz ampoule into a vacuum state of about $10^{-5}$ torr. The mole fraction of europium chloride ($EuI_3$) was 0.5 m %. The sealed quartz ampoule was grown to a thallium alkaline earth halide ($TlSr_2I_5$:yEu) scintillator in a Bridgman electric furnace. Then, a crystal growth condition of a product of the descent speed of the ampoule and the temperature gradient of the crystal growth part was 0.05~2.0° C./hr.

Figure 12:
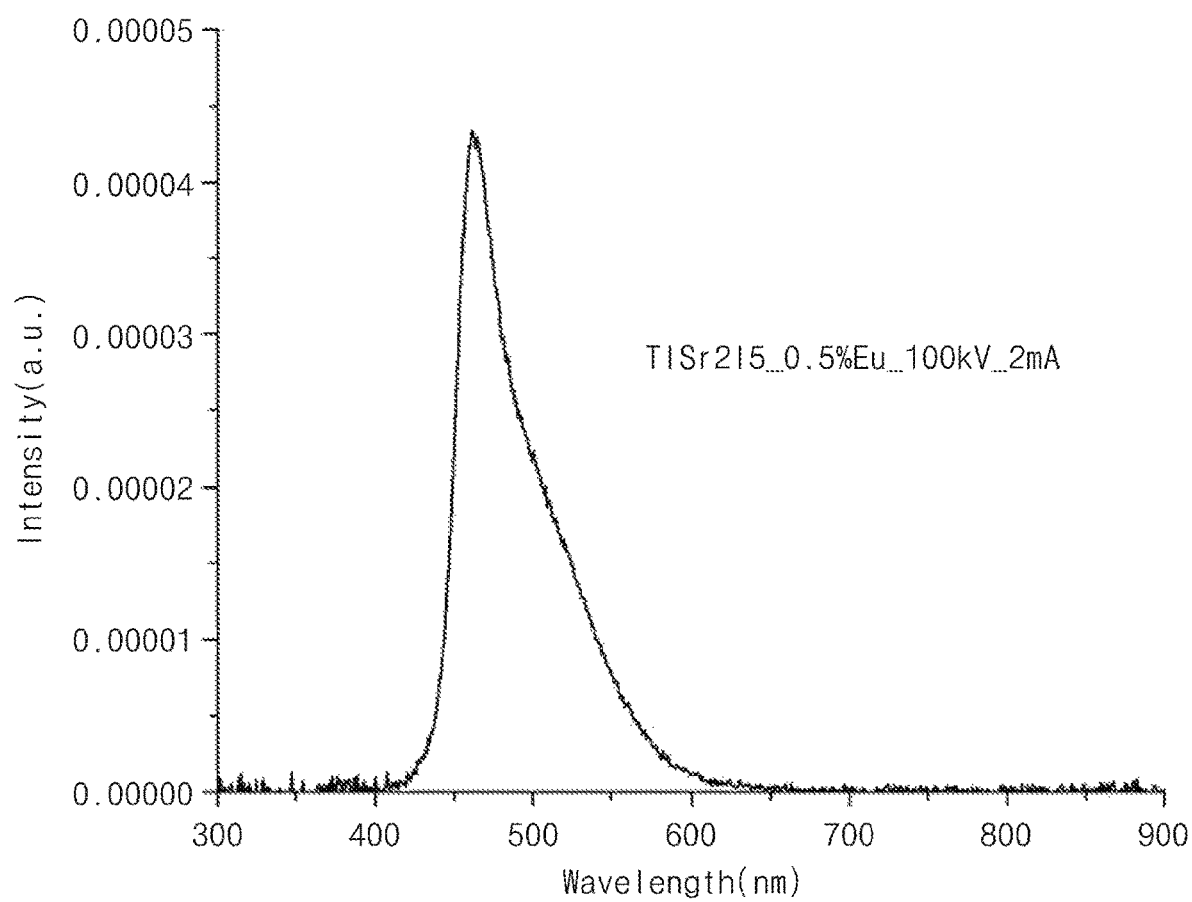
FIG. 12 is a graph depicting a light emission spectrum of a TlSr$_2$I$_5$:Eu$_{0.005}$ scintillator according to an embodiment of the present invention.

FIG. 12 is a graph obtained by measuring a light emission spectrum of a $TlSr_2I_5$:$Eu_{0.005}$ scintillator according to an embodiment of the present invention in a range of 300 to 900 nm by using a spectroscopy. The range of the wavelength of the emitted light of the scintillator was 400 to 650 nm and the peak wavelength was 460 nm for an X-ray of a $TlSr_2I_5$:$Eu_{0.005}$ scintillator regardless of the concentration of the activator, and the result well coincide with the photon efficiency characteristics of a commercial photodiode and a photoelectron multiplier.

Embodiment 8

Figure 13:
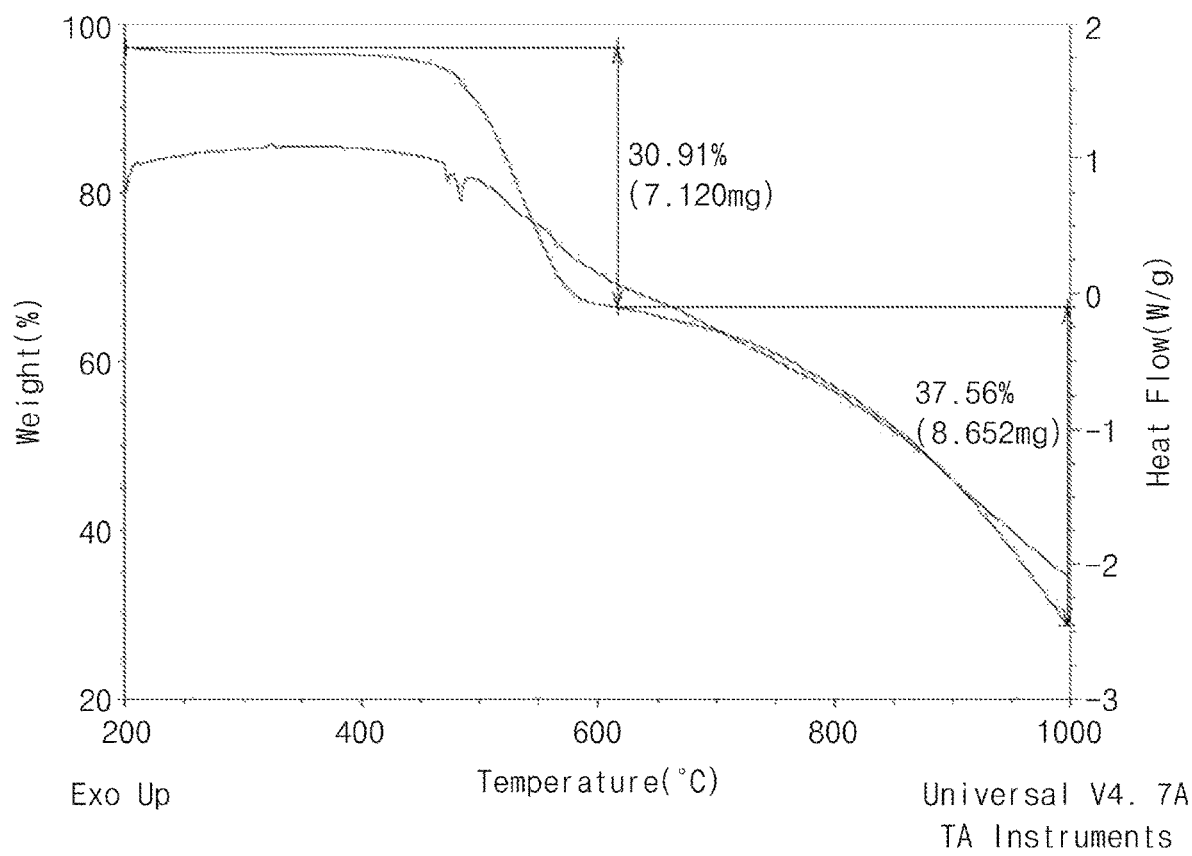
FIG. 13 is a graph depicting a DSC-TGA spectrum of a TlSr$_2$I$_5$ scintillator according to an embodiment of the present invention.

A thallium alkaline earth halide ($Tl_aSr_bI_c$) scintillation crystal was manufactured while taking thallium halide (TlI) and divalent alkaline earth halide ($SrI_2$). After thallium halide (TlI) and alkaline halide ($SrI_2$) are mixed at a mole fraction of 1:2, they are sealed in a quartz ampoule at a vacuum state of about $10^{-5}$ torr. The sealed quartz ampoule was grown to a thallium alkaline earth halide ($TlSr_2I_5$) scintillator in a Bridgman electric furnace. Then, a crystal growth condition of a product of the descent speed of the ampoule and the temperature gradient of the crystal growth part was 0.05~2.0° C./hr. FIG. 13 is a graph depicting a DSC-TGA spectrum of a $TlSr_2I_5$ scintillator according to an embodiment of the present invention. Referring to FIG. 13, it was identified that the single crystal growth temperature of the $TlSr_2I_5$ scintillator is around 600° C.

Embodiment 9

A thallium alkaline earth halide ($Tl_aBa_bI_c$:yEu) scintillation crystal was manufactured by doping a matrix material of thallium halide (TlCl) and 2 divalent alkaline earth halide (TlI) with europium ($BaI_2$). After thallium halide (TlCl) and alkaline earth halide ($BaI_2$) are mixed at a mole fraction of 1:2 and a specific amount of europium chloride ($EuI_3$) is mixed, it is sealed in a quartz ampoule into a vacuum state of about $10^{-5}$ torr. The mole fraction of europium chloride ($EuI_3$) was 0.5 m %. The sealed quartz ampoule was grown to a thallium alkaline earth halide ($TlBa_2I_5$:yEu) scintillator in a Bridgman electric furnace. Then, a crystal growth condition of a product of the descent speed of the ampoule and the temperature gradient of the crystal growth part was 0.05~2.0° C./hr.

Embodiment 10

A thallium alkaline earth halide ($Tl_aBa_bBr_c$) scintillation crystal was manufactured while taking thallium halide (TlBr) and divalent alkaline earth halide ($BaBr_2$). After thallium halide (TlBr) and alkaline halide ($BaBr_2$) are mixed at a mole fraction of 1:2, they are sealed in a quartz ampoule at a vacuum state of about $10^{-5}$ torr. The sealed quartz ampoule was grown to a thallium alkaline earth halide ($TlBa_2Br_5$) scintillator in a Bridgman electric furnace. Then, a crystal growth condition of a product of the descent speed of the ampoule and the temperature gradient of the crystal growth part was 0.05~2.0 t/hr.

Embodiment 11

A thallium alkaline earth halide ($Tl_aBa_bCl_c$:yEu) scintillation crystal was manufactured by doping a matrix material of thallium halide (TlCl) and 2 divalent alkaline earth halide ($CaCl_2$) with europium ($BaCl_2$). After thallium halide (TlCl) and alkaline earth halide ($BaCl_2$) are mixed at a mole fraction of 1:2 and a specific amount of europium chloride ($EuCl_3$) is mixed, it is sealed in a quartz ampoule into a vacuum state of about $10^{-5}$ torr. The mole fraction of europium chloride ($EuCl_3$) was 0.5 m %. The sealed quartz ampoule was grown to a thallium alkaline earth halide ($TlBa_2Cl_5$:yEu) scintillator in a Bridgman electric furnace. Then, a crystal growth condition of a product of the descent speed of the ampoule and the temperature gradient of the crystal growth part was 0.05~2.0° C./hr.

Figure 14:
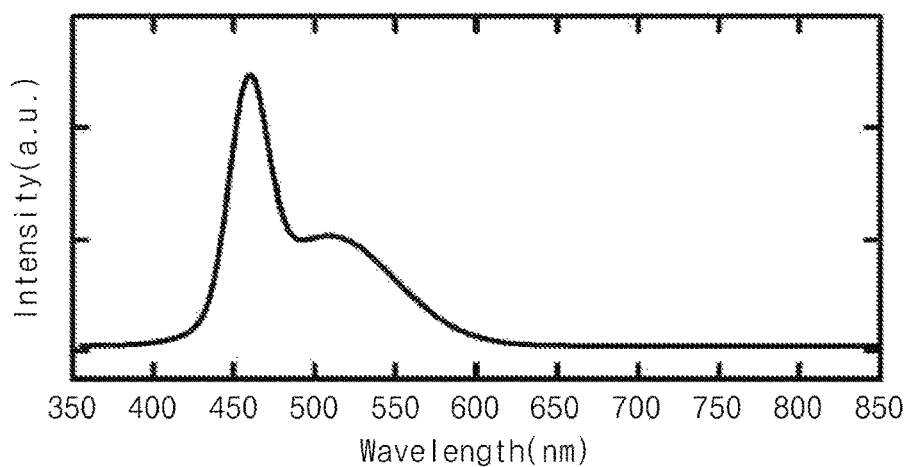
FIG. 14 is a graph depicting a light emission spectrum of a TlSr$_2$I$_5$:Eu$_{0.005}$ scintillator according to an embodiment of the present invention.
Figure 15:
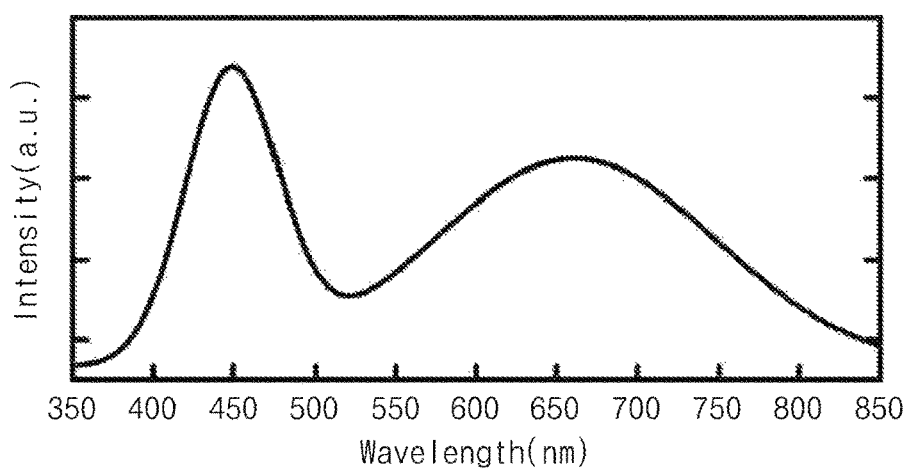
FIG. 15 is a graph depicting a light emission spectrum of a TlBa$_2$Br$_5$:Eu$_{0.005}$ scintillator according to an embodiment of the present invention.
Figure 16:
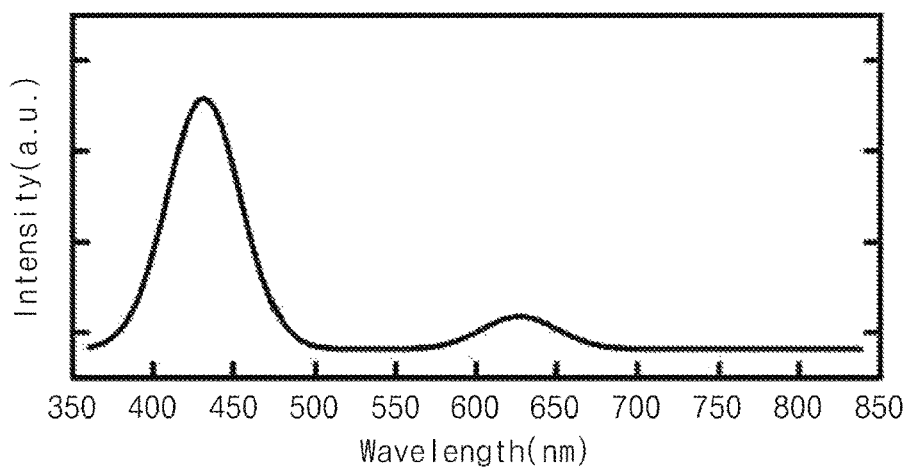
FIG. 16 is a graph depicting a light emission spectrum of a TlBa$_2$I$_5$:Eu$_{0.005}$ scintillator according to an embodiment of the present invention.

FIG. 14 is a graph obtained by measuring a light emission spectrum of a $TlBa_2I_5$:$Eu_{0.005}$ scintillator according to an embodiment of the present invention in a range of 350 to 850 nm by using a spectroscopy. FIG. 15 is a graph obtained by measuring a light emission spectrum of a $TlBa_2Br_5$ scintillator according to an embodiment of the present invention in a range of 350 to 850 nm by using a spectroscopy. FIG. 16 is a graph obtained by measuring a light emission spectrum of a $TlBa_2Cl_5$:$Eu_{0.005}$ scintillator according to an embodiment of the present invention in a range of 350 to 850 nm by using a spectroscopy. Referring to FIGS. 14 and 16, the range of the wavelength of the emitted light of the scintillator was 400 to 650 nm and the peak wavelength was 460 nm for X-rays of a $TlBa_2I_5:Eu_{0.005}$ scintillator, a $TlBa_2Br_5$ scintillator, a $TlBa_2Cl_5:Eu_{0.005}$ scintillator regardless of the concentration of the activator, and the result well coincide with the photon efficiency characteristics of a commercial photodiode and a photoelectron multiplier.

The scintillator according to an embodiment of the present invention takes thallium as a matrix, and because the atomic number of thallium is a very high number of 81, the detection efficiency of thallium for an radioactive ray, such as an X-ray, a gamma ray, an ultraviolet ray, an alpha ray, or a beta ray is high so that an exposure dose for a human body may be reduced when the scintillator is used in a medical field. Further, the present invention may reduce manufacturing costs by easily growing a scintillation crystal and may be applied to fields that require quick time characteristics, such as a positron emission tomography device. Further, because the range of the wavelength of the emitted light of the scintillator according to the embodiment is well matched with the positron efficiency characteristics, the material of the scintillator may be used as a radioactive sensor for measuring radioactive rays of various kinds, such as an ultraviolet ray, an electron ray, alpha particles, and beta particles. The radioactive image equipment may be used for computed tomography (CT), positron emission tomography (PET), single photon emission tomography, or an anger camera.

It is noted that the above embodiments are suggested for understanding of the present invention and do not limit the scope of the present invention, and various modifiable embodiments also fall within the scope of the present invention. It should be understood that the technical protection range of the present invention has to be determined by the technical spirit of the claims, and the technical protection range of the present invention is not limited to the lexical meaning of the claims but reaches even to the equivalent inventions.

The invention claimed is:

1. A scintillator comprising:
a matrix material including thallium, at least one rare earth element, and at least one halogen element,
wherein the matrix material does not include an alkaline element as a main substance,
wherein a chemical formula of the scintillator is $Tl_aA_bB_c$:yCe, and
wherein A is at least one rare earth element selected from trivalent rare earth elements, B is at least one halogen element selected from halogen elements, a is 1, b is 2, and c is 7, and y is equal to or more than 0 and equal to or less than 0.5.

2. The scintillator of claim 1, further comprising:
an activator, with which the matrix material is doped,
wherein the activator includes cerium.

3. The scintillator of claim 1, wherein the at least one rare earth element includes at least one of Gd, Y, Lu, Sc, and Ce.

4. The scintillator of claim 1, wherein the at least one halogen element includes at least one of Cl, Br, and I.

5. The scintillator of claim 1, wherein the matrix material includes thallium halide and rare earth halide.

6. A method of manufacturing a scintillator, the method comprising:
manufacturing a matrix material including thallium, at least one rare earth element, and at least one halogen element,
wherein the matrix material does not include an alkaline element as a main substance,
wherein a chemical formula of the scintillator is $Tl_aA_bB_c$:yCe, and
wherein A is at least one rare earth element selected from trivalent rare earth elements, B is at least one halogen element selected from halogen elements, a is 1, b is 2, and c is 7, and y is equal to or more than 0 and equal to or less than 0.5.

7. The method of claim 6, wherein the manufacturing of the matrix material includes: mixing thallium halide and rare earth halide at a mole fraction of 1:2, 2:1, or 3:1.

8. The method of claim 6, further comprising:
doping the matrix material with an activator including cerium halide.

9. The method of claim 6, further comprising:
growing the matrix material into a single crystal,
wherein the growing the matrix material into the single crystal includes:
descending an ampoule, in which the matrix material is sealed, while heating the ampoule in a Bridgman electric furnace, and
wherein the crystal is grown as the ampoule descends a crystal growth part in the Bridgman electric furnace, a product of a descent speed of the ampoule in the Bridgman electric furnace and a temperature gradient of the crystal growth part in the Bridgman electric furnace is in a range of 0.05 to 2.0° C./hr, and the temperature gradient of the crystal growth part is a ratio of a change rate of a temperature with respect to a locational change at a crystal growth location in the Bridgman electric furnace.

* * * * *